(12) United States Patent
Sakogawa

(10) Patent No.: US 11,716,838 B2
(45) Date of Patent: Aug. 1, 2023

(54) SEMICONDUCTOR DEVICE AND METHOD FOR FORMING THE WIRING STRUCTURES AVOIDING SHORT CIRCUIT THEREOF

(71) Applicant: MICRON TECHNOLOGY, INC., Boise, ID (US)

(72) Inventor: Yasuyuki Sakogawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 17/400,002

(22) Filed: Aug. 11, 2021

(65) Prior Publication Data
US 2023/0050713 A1    Feb. 16, 2023

(51) Int. Cl.
*H10B 12/00*   (2023.01)
*G11C 5/06*    (2006.01)

(52) U.S. Cl.
CPC ............. *H10B 12/312* (2023.02); *G11C 5/06* (2013.01); *H10B 12/482* (2023.02); *H10B 12/50* (2023.02)

(58) Field of Classification Search
CPC ...... G11C 5/06; H10B 12/312; H10B 12/482; H10B 12/50
See application file for complete search history.

(56) References Cited

U.S. PATENT DOCUMENTS

| | | | |
|---|---|---|---|
| 6,809,364 B2* | 10/2004 | Matsuoka | H10B 12/0335 257/305 |
| 2004/0021159 A1* | 2/2004 | Matsuoka | H10B 12/50 257/296 |
| 2019/0206877 A1* | 7/2019 | Kim | H10B 61/22 |
| 2022/0406792 A1* | 12/2022 | Yamaguchi | H10B 12/488 |

FOREIGN PATENT DOCUMENTS

| | | | | |
|---|---|---|---|---|
| CN | 1302085 A | * | 7/2001 | ........... G11C 7/1048 |
| JP | 2000353793 A | * | 12/2000 | ....... H01L 27/10814 |

* cited by examiner

*Primary Examiner* — Edward Chin
(74) *Attorney, Agent, or Firm* — Dorsey & Whitney LLP

(57) ABSTRACT

A apparatus includes a memory cell region; a peripheral region adjacent to the memory cell region; first, second, third, fourth and fifth bit-lines arranged in numerical order and extending across the memory cell region and the peripheral region; and first, second and third bit-line contacts connecting with the first, third and fifth bit-lines in the peripheral region, respectively; wherein the first and second bit-line contacts are arranged adjacently without interposing the second bit-line therebetween; and wherein the second and third bit-line contacts are arranged adjacently with interposing the fourth bit-line therebetween.

16 Claims, 22 Drawing Sheets

SEMICONDUCTOR DEVICE AND METHOD FOR FORMING THE WIRING STRUCTURES AVOIDING SHORT CIRCUIT THEREOF

BACKGROUND

In semiconductor devices such as dynamic random access memory (hereinafter referred to as DRAM) for example, further miniaturization is being pursued in order to increase the data storage capacity. For example, the size of the repeating pitch of interconnects such as DRAM word-lines and bit-lines is being reduced, and the distance between the word-lines and between the bit-lines is being shortened. However, if the positioning with respect to the word-lines and bit-lines is misaligned in the formation of the contact electrodes connected to the word-lines and bit-lines, a contact electrode that should be connected to a certain word-line may become connected to an adjacent word-line, or a contact electrode that should be connected to a certain bit-line may become connected to an adjacent bit-line.

BRIEF DESCRIPTION OF THE DRAWINGS

FIGS. 5A and 5B to FIGS. 22A and 22B are diagrams illustrating a method of forming the semiconductor device according to an embodiment, and illustrating an example of the schematic configuration in exemplary process stages. FIGS. 5A to 22A are plan views illustrating an example of the schematic configuration in exemplary process stages. FIGS. 5B to 22B are longitudinal sections illustrating the schematic configuration of the portion along the line X-X in FIGS. 5A to 22A;

DETAILED DESCRIPTION

Figure 1:
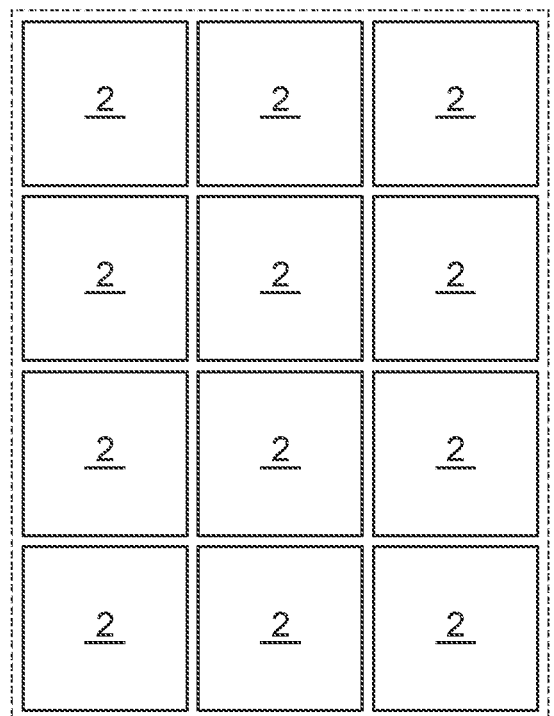
FIG. 1 is a plan view illustrating a schematic configuration of part of a memory cell region of a semiconductor device according to an embodiment.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor device and a method of forming the same according to an embodiment will be described with reference to the drawings. The semiconductor device according to the embodiment will be described by taking DRAM as an example. In the description of the embodiment, common or related elements and elements that are substantially the same are denoted with the same signs, and the description thereof will be reduced or omitted. In the drawings referenced hereinafter, the dimensions and dimensional ratios of each unit in each of the drawings do not necessarily match the actual dimensions and dimensional ratios in the embodiment. Also, in the following description, the vertical direction means the vertical direction in the case where a semiconductor substrate 10 is on the bottom.

Figure 2:
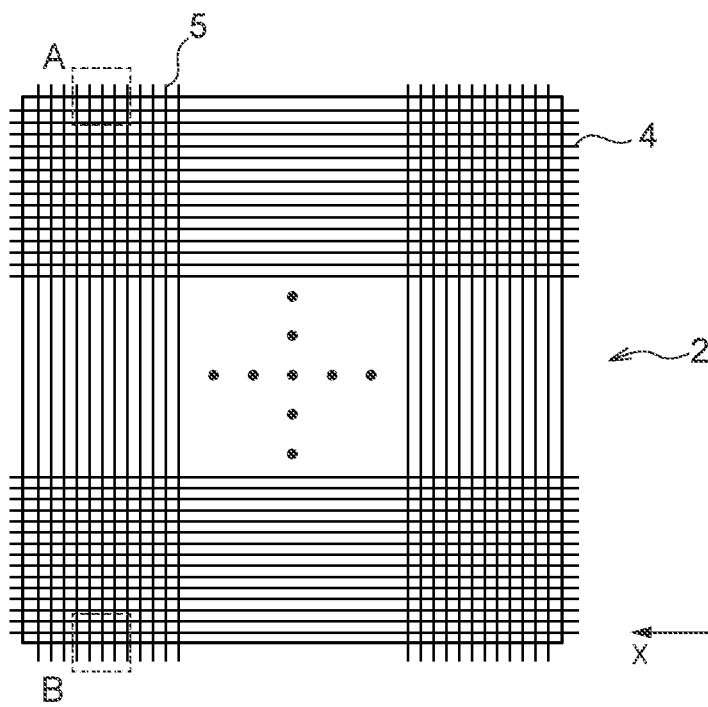
FIG. 2 is a plan view illustrating a schematic configuration of a memory mat.

FIGS. 1 and 2 are diagrams illustrating plan-view layouts of the semiconductor device according to the embodiment. As illustrated in FIG. 1, the semiconductor device is provided with a plurality of memory mats 2 disposed in a matrix on the surface of a semiconductor substrate. As illustrated in FIG. 2, in each of the memory mats 2, a plurality of word-lines 4 are disposed in parallel, extending in the X direction of the diagram. Additionally, a plurality of bit-lines 5 are disposed in the memory mats 2 in parallel, extending orthogonally to the word-lines 4, or in other words in the Y direction of the diagram. The direction parallel to the word-lines 4, or in other words the X direction, is designated the word-line direction. The direction parallel to the bit-lines 5, or in other words the Y direction, is designated the bit-line direction.

Each word-line 4 is connected to a row decoder not illustrated in a peripheral part thereof. The row decoder accepts the input of a row address selected when reading/writing a memory cell from a row address buffer not illustrated. The plurality of word-lines 4 are each paired with a corresponding one of a plurality of memory cells, and control access to a plurality of corresponding memory cells among the plurality of memory cells.

Memory mat end regions A and B are disposed in peripheral parts in the bit-line direction of the memory mats 2. Each bit-line 5 is connected to a column decoder not illustrated in the peripheral part thereof. The column decoder accepts the input of a column address selected when reading/writing a memory cell from a column address buffer not illustrated. The plurality of bit-lines 5 are each paired with a corresponding one of the plurality of memory cells, and control access to corresponding memory cells among the plurality of memory cells.

Figure 3:
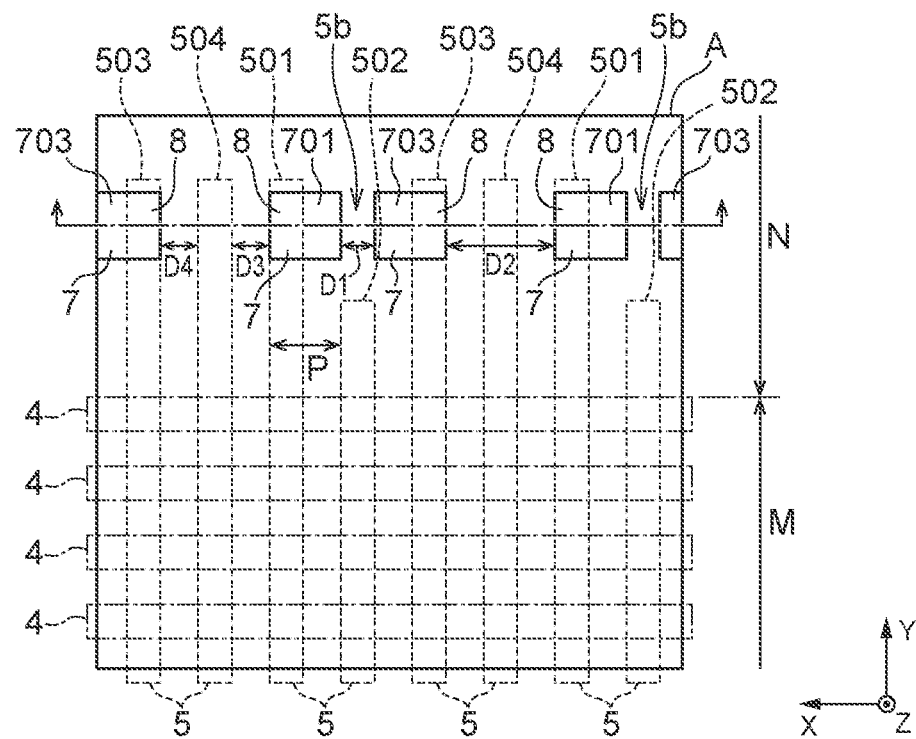
FIG. 3 is a plan-view layout illustrating a schematic configuration of the memory cell region of the semiconductor device according to an embodiment, and is an enlarged view of a memory mat end region A in FIG. 2.
Figure 4:
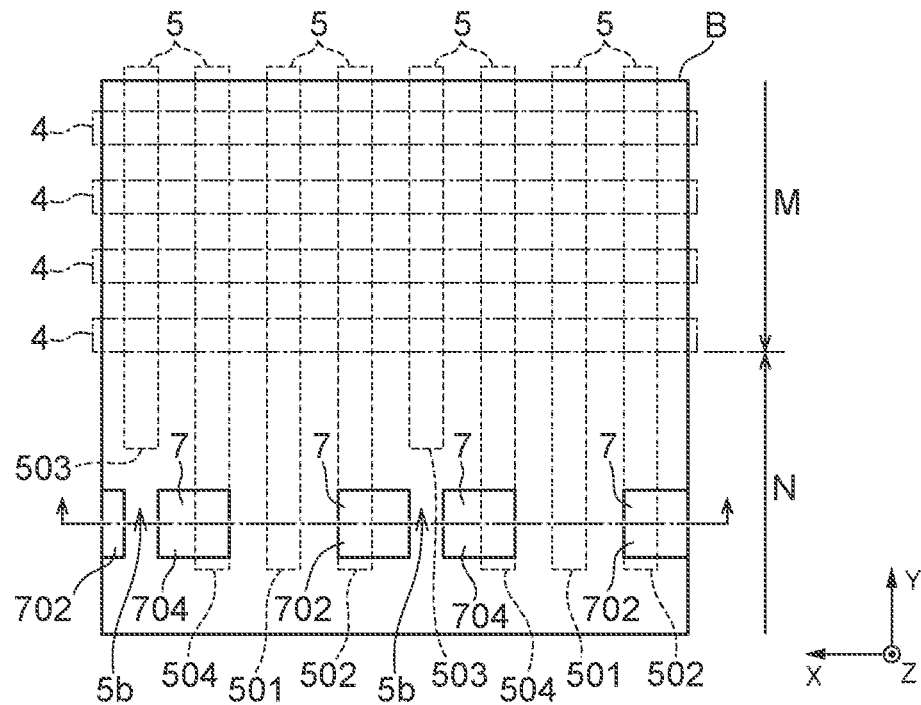
FIG. 4 is a plan-view layout illustrating a schematic configuration of the memory cell region of the semiconductor device according to an embodiment, and is an enlarged view of a memory mat end region B in FIG. 2.

FIG. 3 is an enlarged layout view of the memory mat end region A in FIG. 2. FIG. 4 is an enlarged layout view of the memory mat end region B in FIG. 2. The layout illustrated in FIG. 4 has an arrangement symmetric with the layout illustrated in FIG. 3, and the other configurations are the same. The structures in FIGS. 3 and 4, including the cross-sectional structures, are substantially the same. The description of the semiconductor device according to the embodiment will refer to FIG. 3.

As illustrated in FIG. 3, in the memory mat end region A, the semiconductor device is provided with a memory cell region M and a peripheral region N. In the memory cell region M, a plurality of word-lines 4 disposed at the same repeating pitch in the Y direction are arranged orthogonally to a plurality of bit-lines 5 disposed at the same repeating pitch P in the X direction. The bit-lines 5 may be examples of wirings. Active regions not illustrated that form the memory cells are disposed at the intersection points between the word-lines 4 and the bit-lines 5. In the peripheral region N, peripheral circuits such as the row decoder and the row address buffer not illustrated are provided.

In FIG. 3, the plurality of bit-lines 5 are categorized into bit-lines 501, bit-lines 502, bit-lines 503 and bit-lines 504. The bit-lines 501, the bit-lines 502, the bit-lines 503, and the bit-lines 504 are disposed in numerical order. The plurality of bit-lines 5 are arranged so that the bit-line 501, the bit-line 502, the bit-line 503, and the bit-line 504 are set as one group and this group is repeated.

The plurality of bit-lines 5 are disposed extending linearly in the Y direction from the memory cell region M and across the peripheral region N. In the peripheral region N, the bit-lines 501, the bit-lines 503, and the bit-lines 504 have the same length. In the peripheral region N, the bit-lines 501, the bit-lines 503, and the bit-lines 504 are longer than the bit-lines 502.

In the peripheral region N, bit-line contacts 7 are connected to the bit-lines 501 and the bit-lines 503. The bit-line contacts 7 are connected to the bit-lines 501 and the bit-lines 503 in edge portions 8 of the bit-lines 5. The edge portions 8 correspond to overlapping portions between the bit-lines 5 and the bit-line contacts 7. The bit-line contacts 7 connected to the bit-lines 501 are designated bit-line contacts 701, and the bit-line contacts 7 connected to the bit-lines 503 are designated bit-line contacts 703.

In the peripheral region N, the bit-lines 502 to which the bit-line contacts 7 are not connected are disposed between the bit-lines 501 and the bit-lines 503 to which the bit-line contacts 7 are connected. The bit-lines 502 are shorter than the other bit-lines 5. Bit-line non-existing regions 5b which are interposed between the bit-line contacts 7 and in which no bit-line 5 exists are disposed so as to be located on extension lines in the extending direction, or in other words the Y direction of the bit-lines 502. The bit-line non-existing regions 5b may be examples of wiring non-existing regions.

Further, the bit-lines 504 to which the bit-line contacts 7 are not connected are disposed between the bit-lines 501 and the bit-lines 503 to which the bit-line contacts 7 are connected. The bit-lines 501, the bit-lines 503, and the bit-lines 504 have the same length. Therefore, the bit-lines 504 exist in regions interposed between the bit-line contacts 701 and the bit-line contacts 703 so as to be located on extension lines in the extending direction, or in other words the Y direction of the bit-lines 504.

The bit-line contact 701 and the bit-line contact 703 interposing the bit-line non-existing region 5b therebetween are arranged to be close to the bit-line non-existing region 5b. The bit-line contact 701 and the bit-line contact 703 are arranged so as not to interpose the bit-line 502 therebetween. The bit-line contact 701 and the bit-line contact 703 are arranged apart from each other on the side where the bit-line non-existing region 5b is not interposed therebetween, that is, on the bit-line 504 side. The bit-line contact 701 and the bit-line contact 703 are arranged so as to interpose the bit-line 504 therebetween. The distance D1 between the bit-line contact 701 and the bit-line contact 703 which interpose the bit-line non-existing region 5b therebetween is shorter than the distance D2 between the bit-line contact 701 and the bit-line contact 703 on the side where they do not interpose the bit-line non-existing region 5b therebetween, that is, on the side where they interpose the bit-line 504 therebetween. In other words, the bit-line contacts 701 and the bit-line contacts 703 are arranged so that "distance D1<distance D2" is satisfied.

At this time, the center of width of the bit-line contact 701 is disposed to be shifted from the center of width of the bit-line 501 in a direction to the bit-line non-existing region 5b. The center of width of the bit-line contact 702 is disposed to be shifted from the center of width of the bit-line 503 in a direction to the bit-line non-existing region 5b. The center of width of the bit-line contact 701 is disposed to be shifted from the center of width of the bit-line 501 in a first direction. The center of width of the bit-line contact 702 is disposed to be shifted from the center of width of the bit-line 503 in a second direction opposite to the first direction. The center of width of the bit-line contact 701 and the center of width of the bit-line contact 702 are arranged so as to get close to each other with interposing the bit-line non-existing region 5b therebetween.

By arranging the bit-line contacts 7 as described above, the distance D3 between the bit-line contact 701 and the bit-line 504 adjacent to the bit-line contact 701 on the side where the bit-line contact 701 does not interpose the bit-line non-existing region 5b can be increased. Further, the distance D4 between the bit-line contact 703 and the bit-line 504 adjacent to the bit-line contact 703 on the side where the bit-line contact 703 does not interpose the bit-line non-existing region 5b can be increased. Accordingly, a short circuit between each of the bit-line contacts 701 and 703 and the bit-line 504 can be avoided or suppressed.

Further, even if the bit-line contact 701 and the bit-line contact 703 are arranged to be close to the bit-line non-existing region 5b, the bit-line 502 does not exist in the bit-line non-existing region 5b. Therefore, it is possible to suppress a short circuit between each of the bit-line contacts 701 and 703 and the bit-line 502.

As illustrated in FIG. 4, the memory mat end region B has a symmetric relation with the above-described configuration in the memory mat end region A. In the peripheral region N of the memory mat end region B, the relation between the bit-lines 501, 503 and the bit-lines 502, 504 is reversed. In the memory mat end region B, the bit-line contacts 7 (702) are connected to the bit-lines 502, and the bit-line contacts 7 (704) are connected to the bit-lines 504. The bit-line contact 702 and the bit-line contact 704 interposing the bit-line non-existing region 5b therebetween are arranged to be close to the bit-line non-existing region 5b. The bit-line contact 702 and the bit-line contact 704 are arranged apart from each other on the side where they do not interpose the bit-line non-existing region 5b therebetween, that is, on the bit-line 501 side. The distance between the bit-line contact 702 and the bit-line contact 704 on the side where they interpose the bit-line non-existing region 5b therebetween is shorter than the distance between the bit-line contact 702 and the bit-line contact 704 on the side where they do not interpose the bit-line non-existing region 5b therebetween, that is, on the side where they interpose the bit-line 501 therebetween. In the memory mat end region B, a short circuit between each of the bit-line contacts 702 and 704 and each of the bit-lines 501 and 503 can be suppressed.

Figure 23:
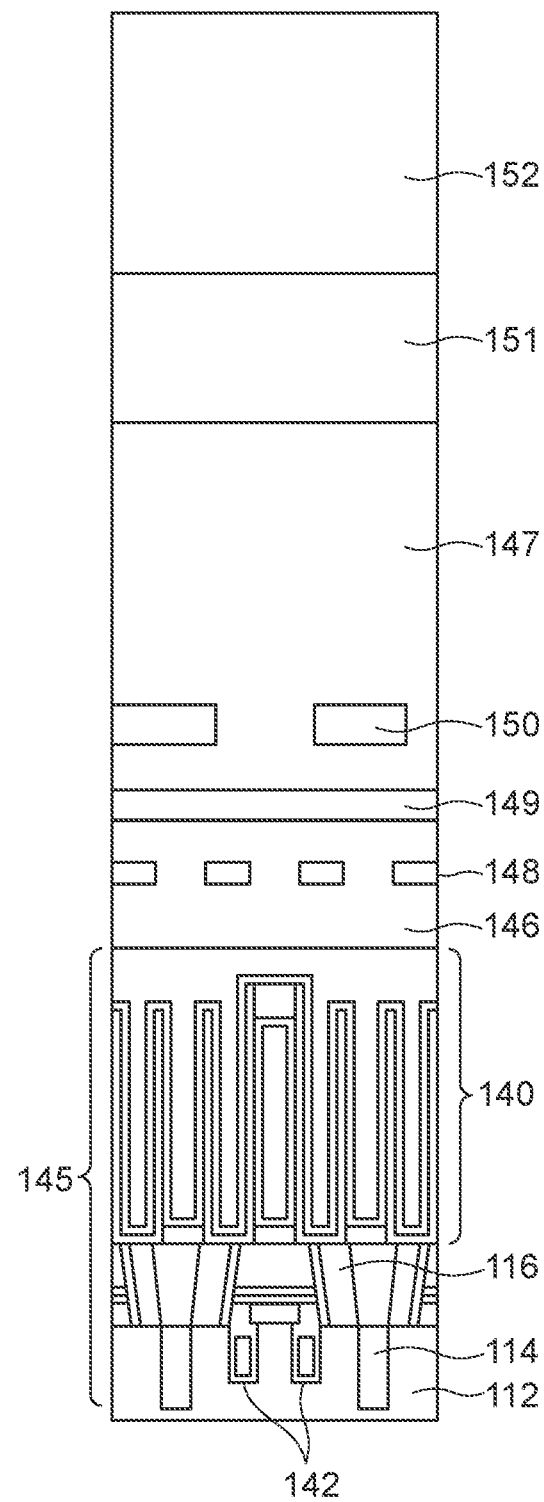
FIG. 23 is a longitudinal section illustrating an example of an overall schematic configuration of the memory cell region of the semiconductor device according to an embodiment.

FIG. 23 is a longitudinal section illustrating one example of an overall schematic configuration of the memory cell region in the semiconductor device according to the embodiment. As illustrated in FIG. 23, below a capacitor 140 are provided components such as a semiconductor substrate 112, a shallow trench isolation 114, an access transistor 142, and a capacitor contact 116 included in a DRAM memory cell 145. The capacitor 140 is provided on the semiconductor substrate 112 in which components such as the shallow trench isolation 114, the access transistor 142, and the capacitor contact 116 are formed. The semiconductor substrate 112 corresponds to the semiconductor substrate 10 described later.

A bottom electrode of the capacitor 140 illustrated in FIG. 23 is electrically connected, through the capacitor contact 116, to one side of a source-drain region of the access transistor 142 formed in an active region of the semiconductor substrate 112. The bottom electrode of the capacitor 140 is connected to the semiconductor substrate 112. A gate electrode of the access transistor 142 corresponds to the word-lines 4 in diagrams such as FIG. 2, FIG. 3, FIG. 4, FIG. 5A, FIG. 5B, FIG. 6A, and FIG. 6B.

As illustrated in FIG. 23, an upper layer part that includes multilevel upper wiring layers containing components such as interconnects 148, 149, 150, and 151 is provided above the capacitor 140. The upper layer part is disposed above the memory cell 145. A top electrode of the capacitor 140 is disposed near the multilevel upper wiring layers containing components such as the interconnects 148, 149, 150, and 151. Elements 146, 147, and 152 illustrated in FIG. 23 contain an insulating material.

The capacitor 140, the upper layer part, and the like are formed subsequently to the step illustrated in FIGS. 22A and 22B similarly to the configuration illustrated in FIG. 23.

Figure 24:
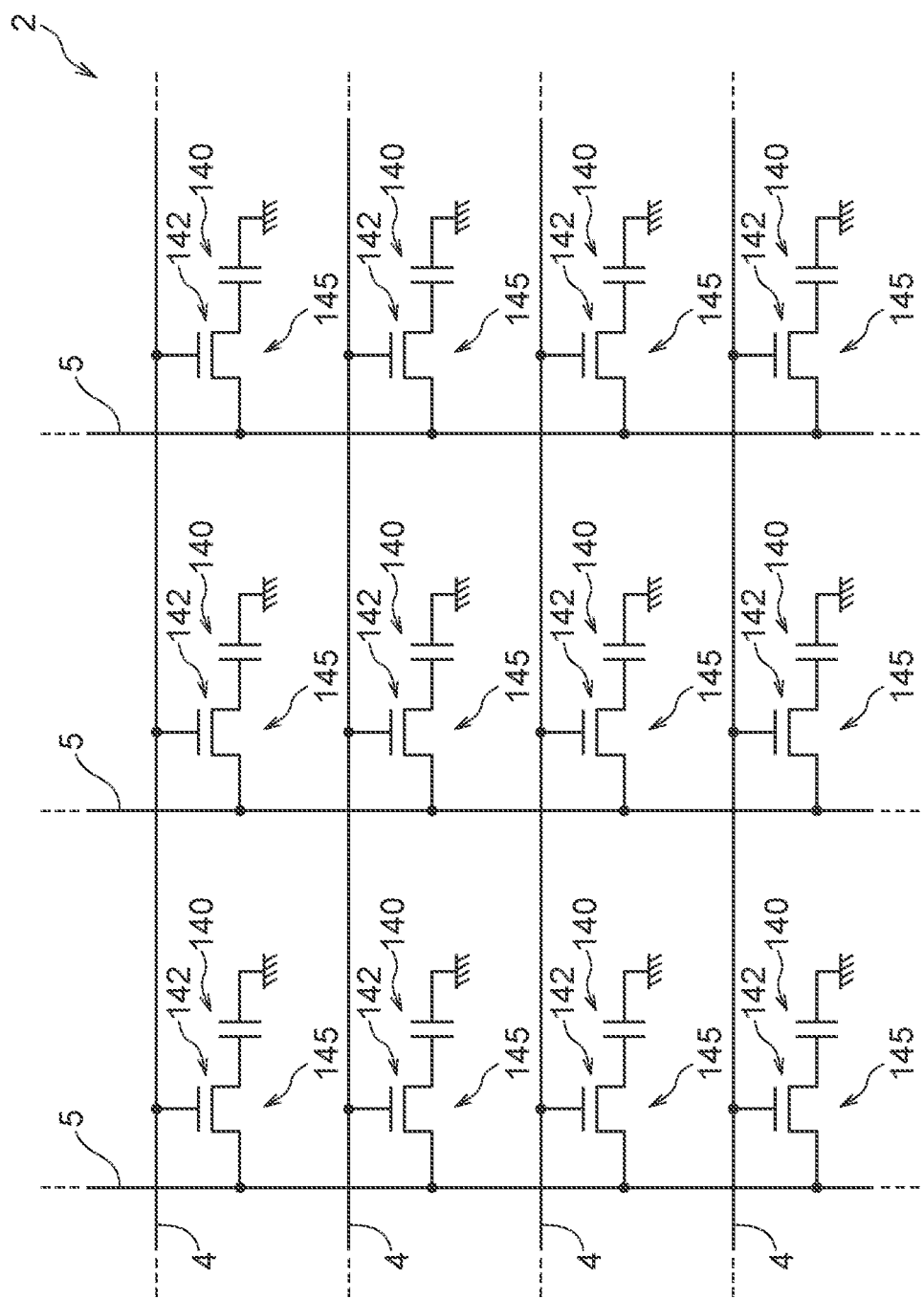
FIG. 24 is a circuit diagram illustrating a schematic configuration of an equivalent circuit of a memory cell of the semiconductor device according to an embodiment.

Also, FIG. 24 illustrates an equivalent circuit of a memory cell array of the semiconductor device according to the embodiment. A plurality of memory cells 145 are arranged in a matrix, with each memory cell 145 being connected to an intersection point between the plurality of word-lines 4 and the plurality of bit-lines 5 disposed orthogonally to each other. A single memory cell 145 includes a pair of the access transistor 142 and the capacitor 140.

The access transistor 142 includes a metal-oxide-semiconductor field-effect transistor (MOSFET), for example. The gate electrode of the access transistor 142 functions as the DRAM word-line 4. The word-line 4 functions as a control line that controls the selection of the corresponding memory cell. One of the source and the drain of the access transistor 142 is connected to one of the bit-lines 5, while the other is connected to the capacitor 140. The capacitor 140 includes a capacitor and stores data by holding accumulated charge in the capacitor.

When writing data to one of the memory cells 145, a potential that turns on the access transistor 142 is applied to the word-line 4, while a low potential or a high potential corresponding to "0" or "1" of data to write is applied to the bit-line 5. When reading out data from one of the memory cells 145, a potential that turns on the access transistor 142 is applied to the word-line 4, and a data determination is made by having a sense amplifier connected to the bit-line 5 sense the potential drawn out from the capacitor 140 to the bit-line 5.

Figure 5A:
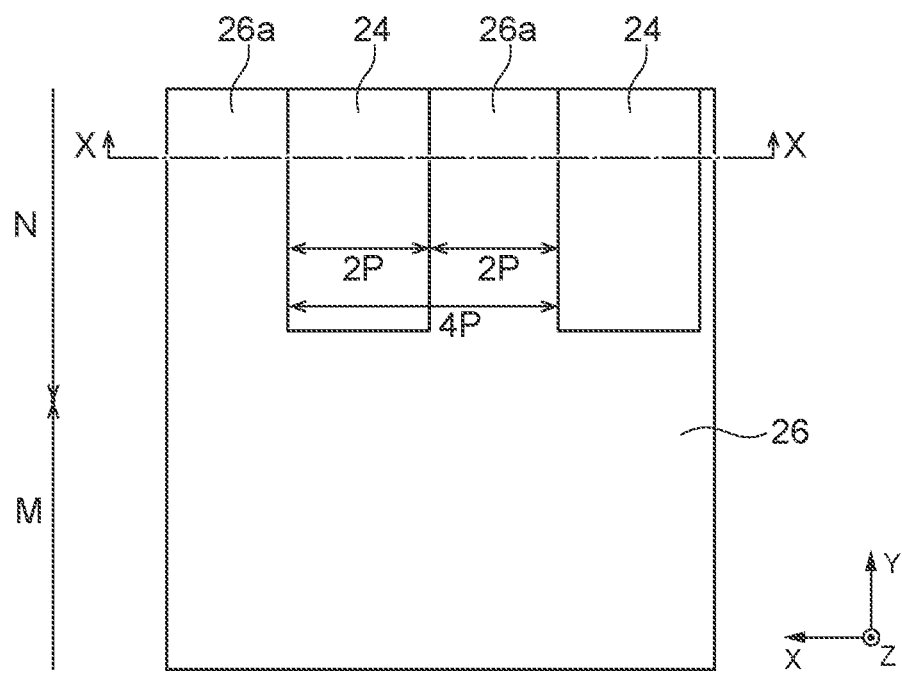
Figure 5B:
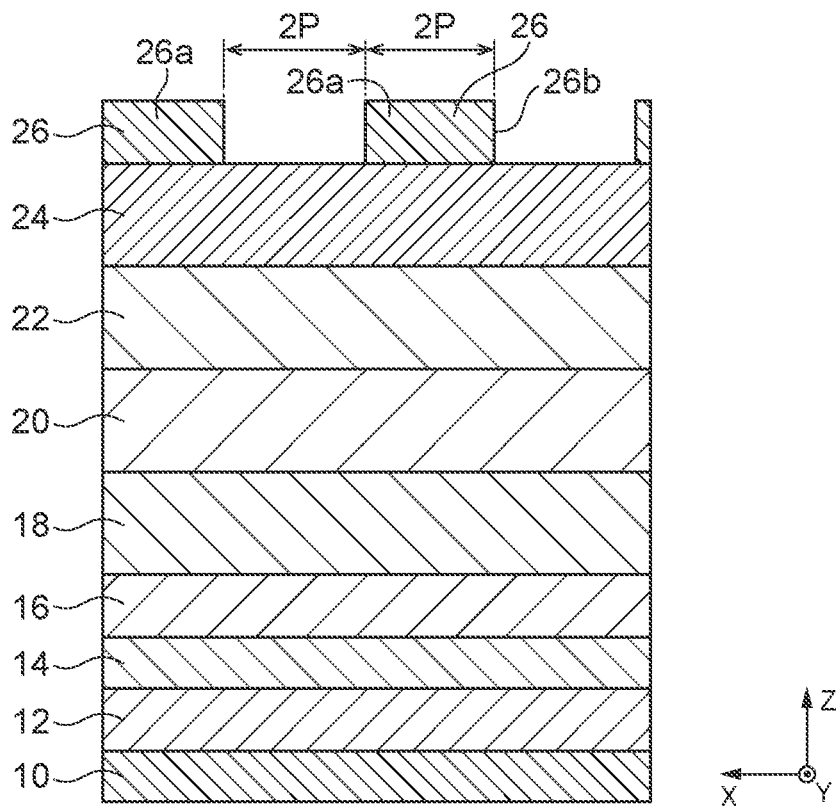

Next, a method of forming the semiconductor device according to the embodiment will be described with reference to the drawings. As illustrated in FIGS. 5A and 5B, a first insulating film 12, a first sacrificial film 14, a conductive film 16, a second sacrificial film 18, a third sacrificial film 20, a fourth sacrificial film 22, and a fifth sacrificial film 24 are formed on the semiconductor substrate 10. Next, a patterned first resist 26 is formed on the fifth sacrificial film 24.

The semiconductor substrate 10 includes, for example, a monocrystalline silicon substrate. The first insulating film 12 contains an insulating film, for example, silicon dioxide ($SiO_2$). The first sacrificial film 14 contains, for example, silicon nitride (SiN). The conductive film 16 contains a conductive material, and contains, for example, a laminated film of tungsten (W) and/or titanium nitride (TiN). The second sacrificial film 18 contains silicon nitride. The third sacrificial film 20 contains, for example, amorphous carbon ($\alpha$-C). The fourth sacrificial film 22 contains, for example, silicon dioxide. The fifth sacrificial film 24 contains, for example, polysilicon (poly-Si). The first insulating film 12, the first sacrificial film 14, the conductive film 16, the second sacrificial film 18, the third sacrificial film 20, the fourth sacrificial film 22, and the fifth sacrificial film 24 are formed, for example, by chemical vapor deposition (hereinafter referred to as "CVD").

The first resist 26 is patterned by using known lithography technology. As illustrated in FIG. 5A, the first resist 26 is formed so as to cover the memory cell region M and have a plurality of projecting parts 26a in the peripheral region N. The fifth sacrificial film 24 is exposed between the projecting parts 26a. The projecting parts 26a are patterned so as to have rectangular shapes which are arranged in parallel in the X direction with the same dimension and the same repeating pitch.

The width in the X direction of the projecting part 26a is equal to 2P which is twice the repeating pitch P of the bit-lines 5 described above. Further, the distance between the adjacent projecting parts 26a is equal to 2P. The repeating pitch in the X direction of the projecting parts 26a is equal to 4P which is four times the repeating pitch of the bit-lines 5 described above.

Figure 6A:
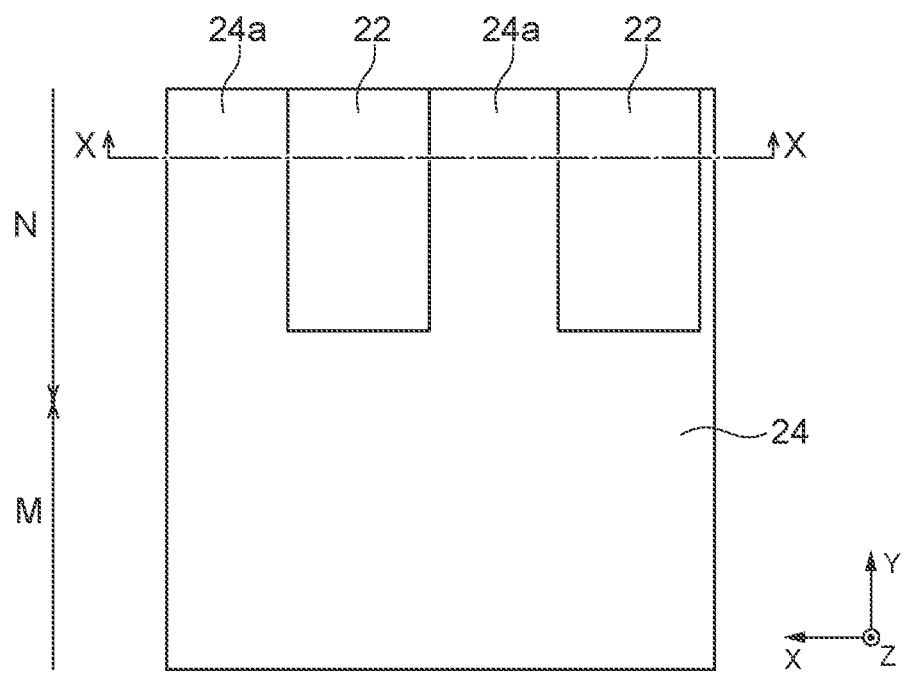
Figure 6B:
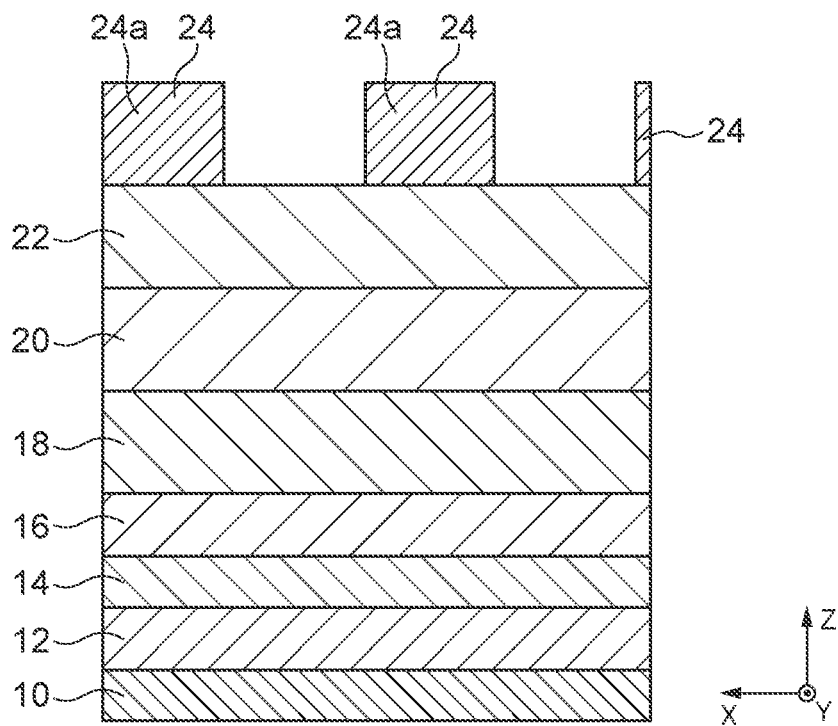

Next, as illustrated in FIGS. 6A and 6B, anisotropic dry etching is performed on the fifth sacrificial film 24 using the first resist 26 as an etching mask, and then the first resist 26 is removed. As a result, the pattern of the first resist 26 is transferred onto the fifth sacrificial film 24. The fifth sacrificial film 24 contains projecting parts 24a in the peripheral region N. The projecting parts 24a are transfers of the projecting parts 26a of the first resist 26. The fourth sacrificial film 22 is exposed between the projecting parts 24a.

Figure 7A:
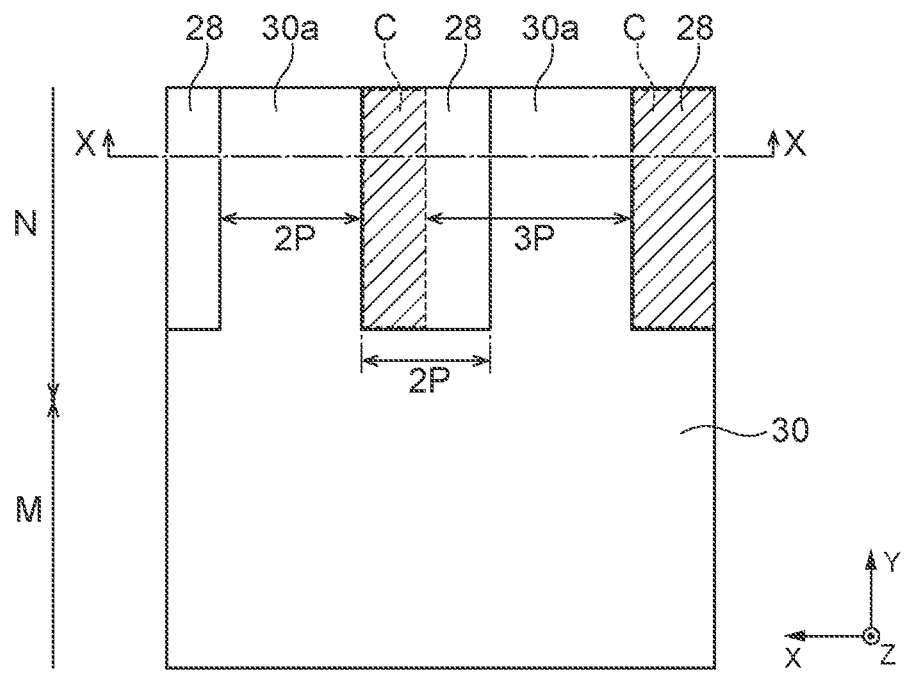
Figure 7B:
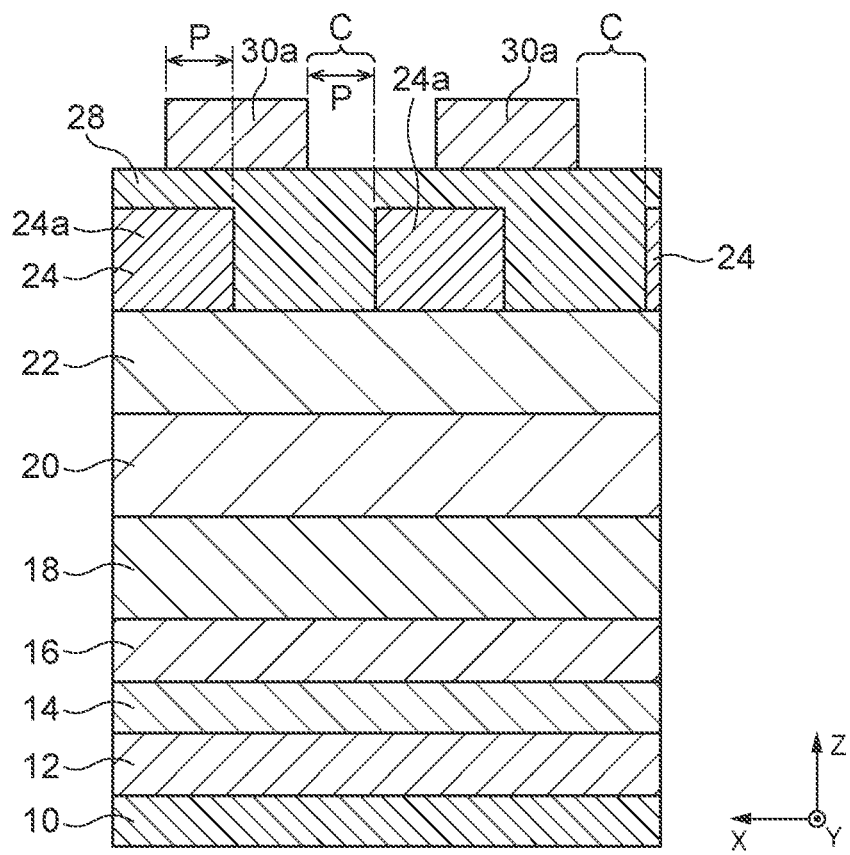

Next, as illustrated in FIGS. 7A and 7B, a sixth sacrificial film 28 is formed so as to cover the side face and top face of the fifth sacrificial film 24, and a patterned second resist 30 is formed on the sixth sacrificial film 28. The sixth sacrificial film 28 includes, for example, a BARC film. The BARC film contains, for example, silicon-contained carbon. The BARC film is formed, for example, by applying a coating liquid containing silicon and carbon and then curing the coating liquid through a baking process. The second resist 30 is patterned by using the known lithography technology.

As illustrated in FIGS. 7A and 7B, the second resist 30 is formed so as to cover the memory cell region M and have a plurality of projecting parts 30a in the peripheral region N. The sixth sacrificial film 28 is exposed between the projecting parts 30a.

The projecting parts 30a are patterned so as to have rectangular shapes which are arranged in parallel in the X direction with the same dimension and the same repeating pitch. The width in the X direction of the projecting part 30a is equal to 2P which is twice the repeating pitch P of the bit-lines 5 described above. Further, the distance between the adjacent projecting parts 30a is equal to 2P.

Each of the projecting parts 30a of the second resist 30 and the fifth sacrificial film 24 are arranged so as to overlap each other in the X direction by only the dimension P. At this time, the X direction dimension of a region C where the projecting part 30a and the fifth sacrificial film 24 do not overlap each other is the same dimension P as the repeating pitch P described above. The distance between adjacent regions C in the X direction is equal to the dimension 3P which is triple the above-mentioned repeating pitch P.

Figure 8A:
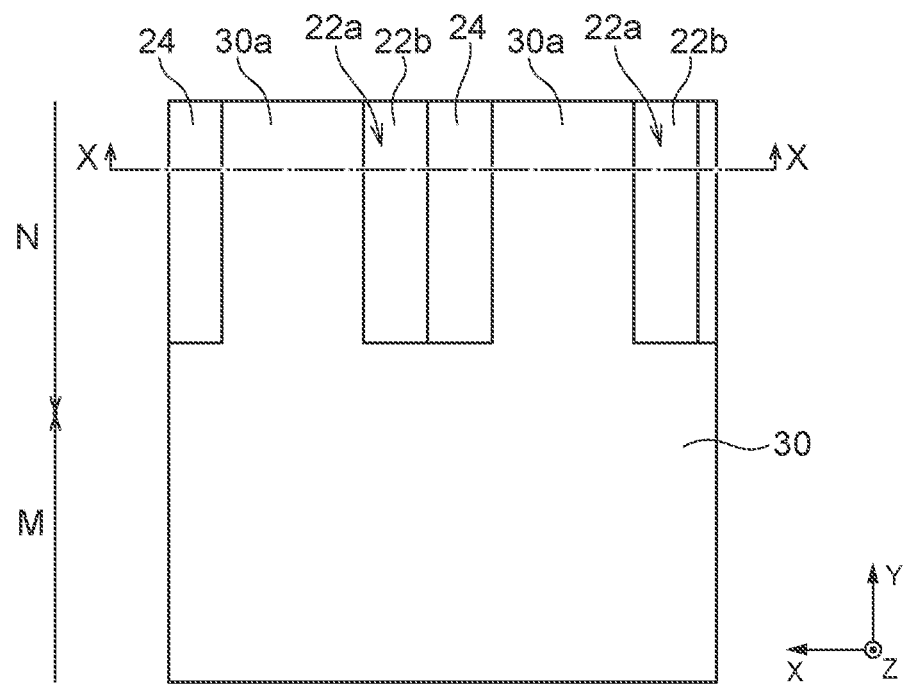
Figure 8B:
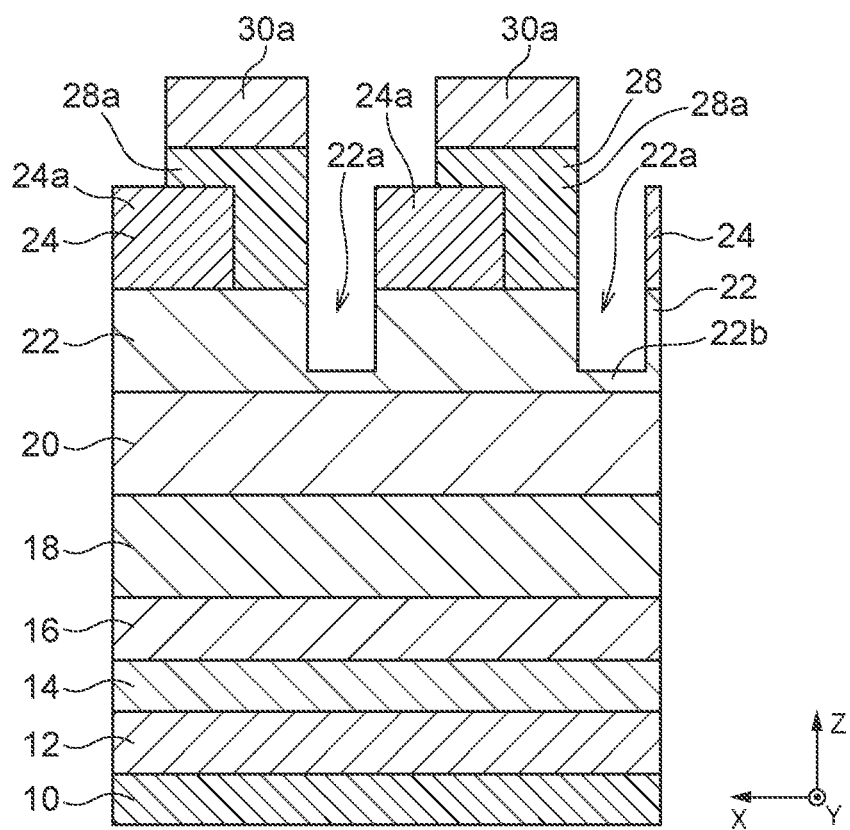

Next, as illustrated in FIGS. 8A and 8B, anisotropic dry etching is performed on the sixth sacrificial film 28 and the fourth sacrificial film 22 by using, as an etching mask, the second resist 30 including the projecting parts 30a and the fifth sacrificial film 24 including the projecting parts 24a. The anisotropic dry etching is set so that the etching rates of the second resist 30 and the fifth sacrificial film 24 are sufficiently smaller than the etching rates of the sixth sacrificial film 28 and the fourth sacrificial film 22. By this anisotropic dry etching, openings 22a are formed in the fourth sacrificial film 22. This anisotropic dry etching is controlled so that thin bottom films 22b remain at the bottoms of the openings 22a. As a result, the top face of the third sacrificial film 20 is not exposed at the bottoms of the openings 22a.

Figure 9A:
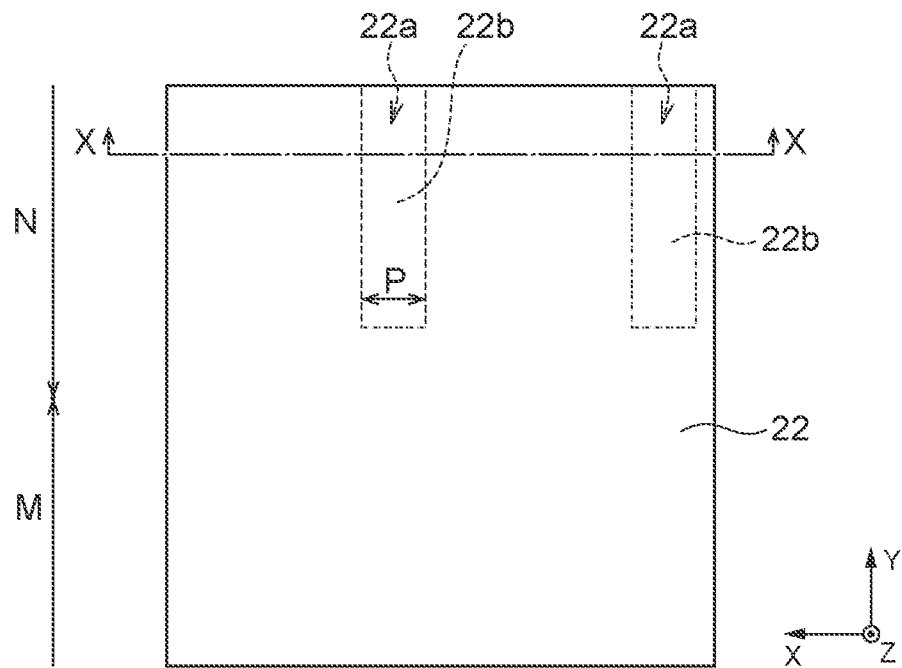
Figure 9B:
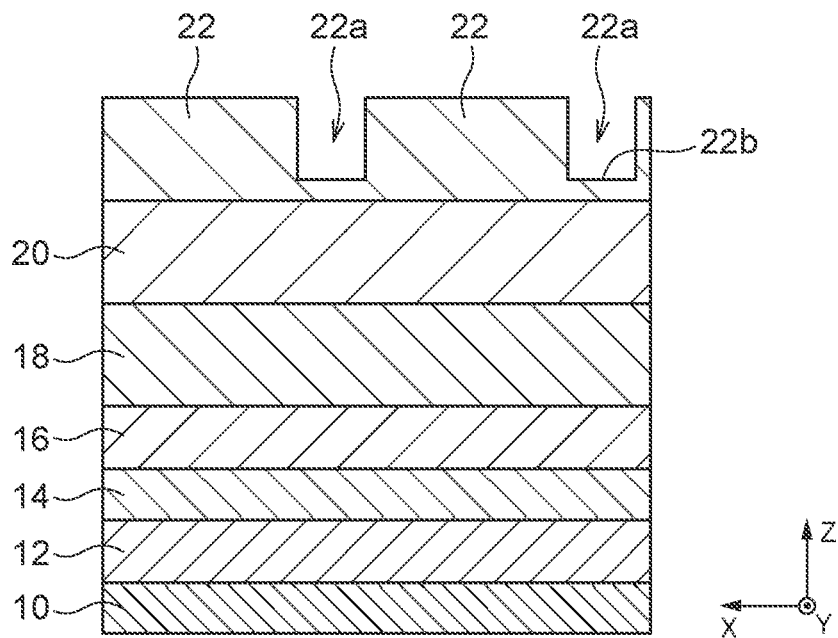
Figure 10A:
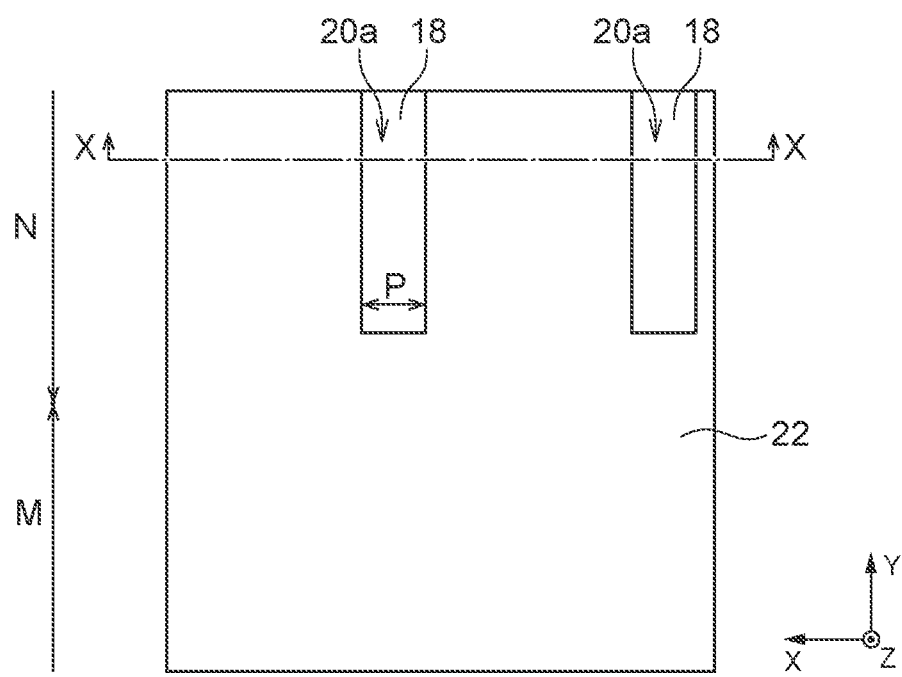
Figure 10B:
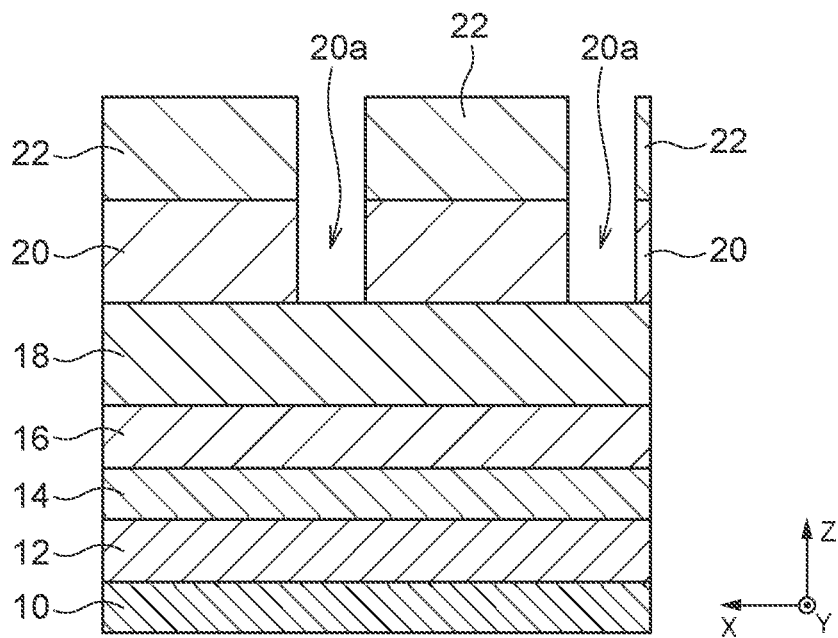

Next, as illustrated in FIGS. 9A and 9B, the second resist 30, the sixth sacrificial film 28, and the fifth sacrificial film 24 are removed. Next, as illustrated in FIGS. 10A and 10B, anisotropic dry etching is performed on the fourth sacrificial film 22 to remove the bottom films 22b and expose the third sacrificial film 20 at the bottoms of the openings 22a. This anisotropic dry etching is performed for only a time which is sufficient to remove the thin bottom films 22b, and is controlled such that the fourth sacrificial film 22 excluding the bottom films 22b remains. Next, anisotropic dry etching is performed on the third sacrificial film 20 using the fourth sacrificial film 22 as an etching mask to form openings 20a. By this anisotropic dry etching, the top face of the second sacrificial film 18 is exposed at the bottoms of the openings 20a.

Figure 11A:
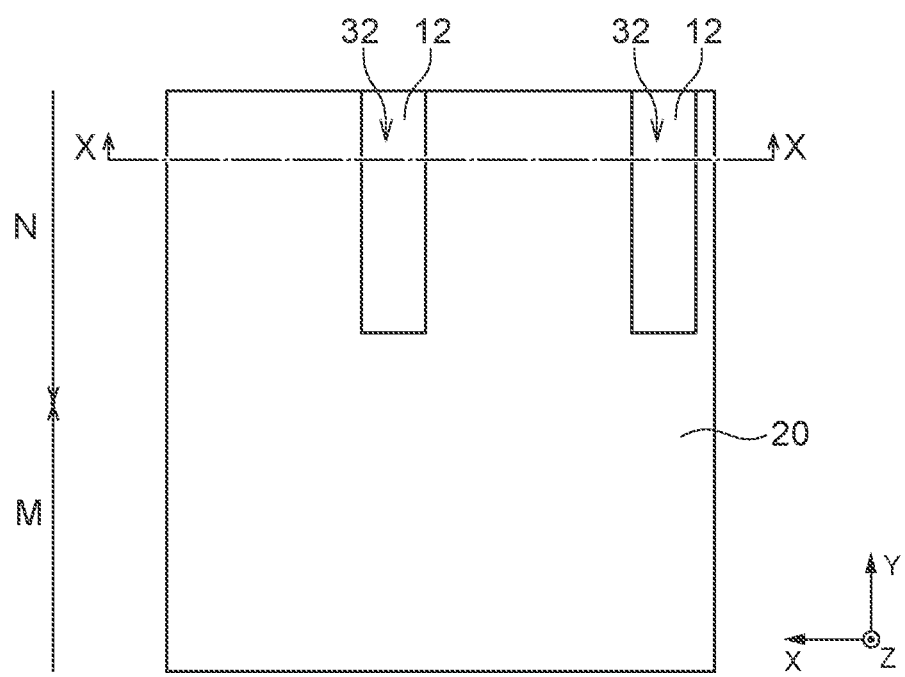
Figure 11B:
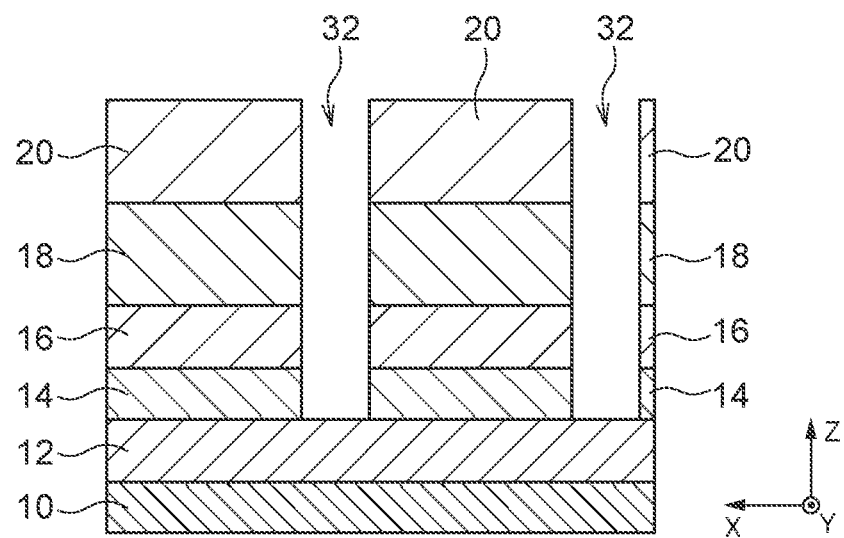

Next, as illustrated in FIGS. 11A and 11B, anisotropic dry etching is performed on the second sacrificial film 18, the conductive film 16 and the first sacrificial film 14 using the patterned fourth sacrificial film 22 and the third sacrificial film 20 as an etching mask to form openings 32. The openings 32 are formed as voids. The top face of the first insulating film 12 is exposed at the bottoms of the openings 32. Further, the fourth sacrificial film 22 is removed during the anisotropic dry etching.

Figure 12A:
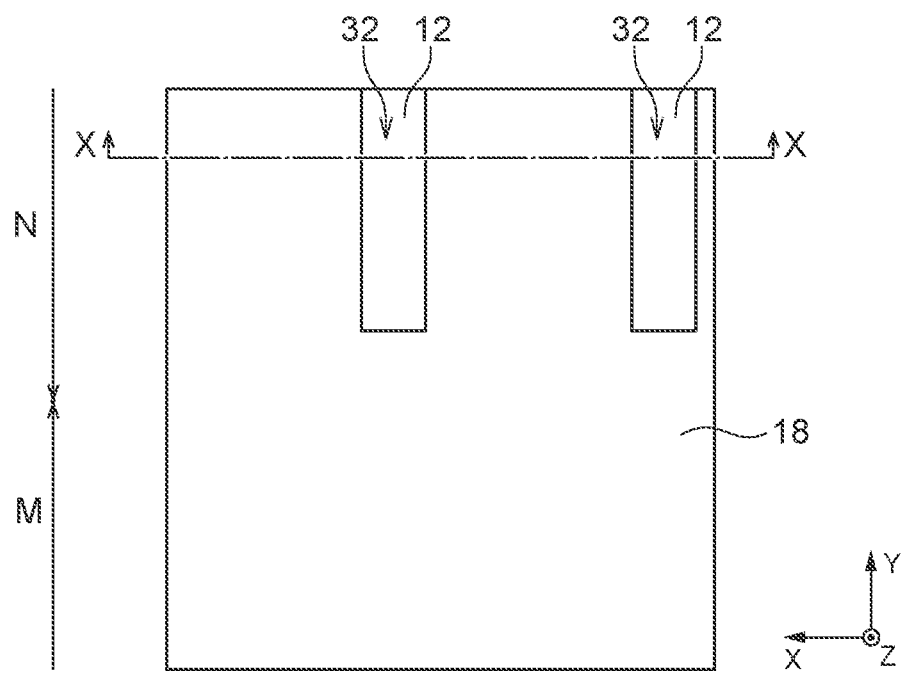
Figure 12B:
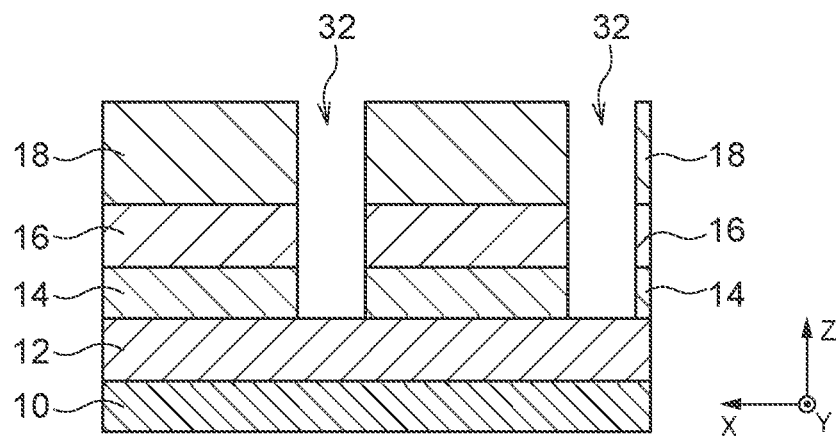
Figure 13A:
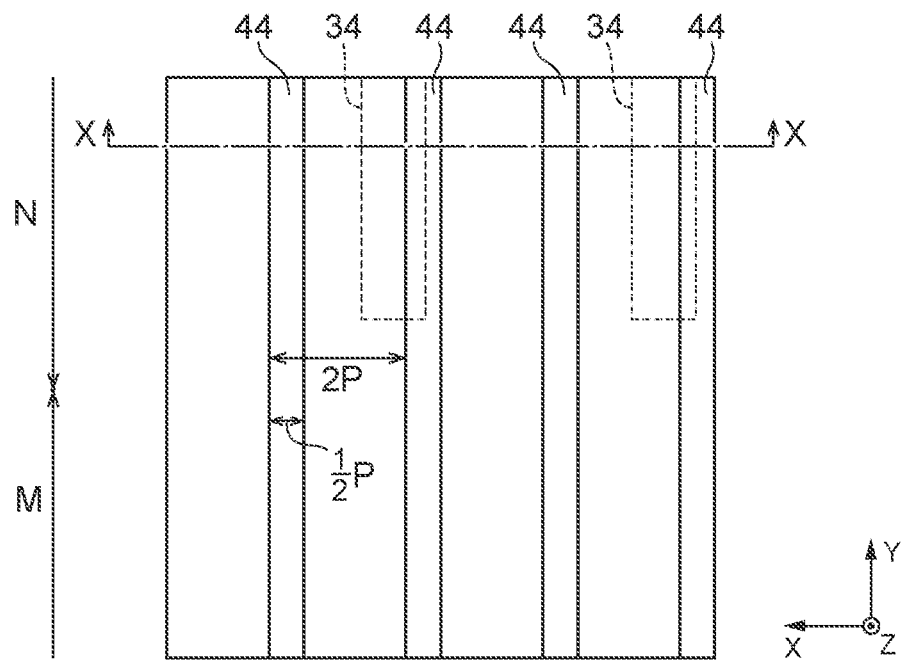
Figure 13B:
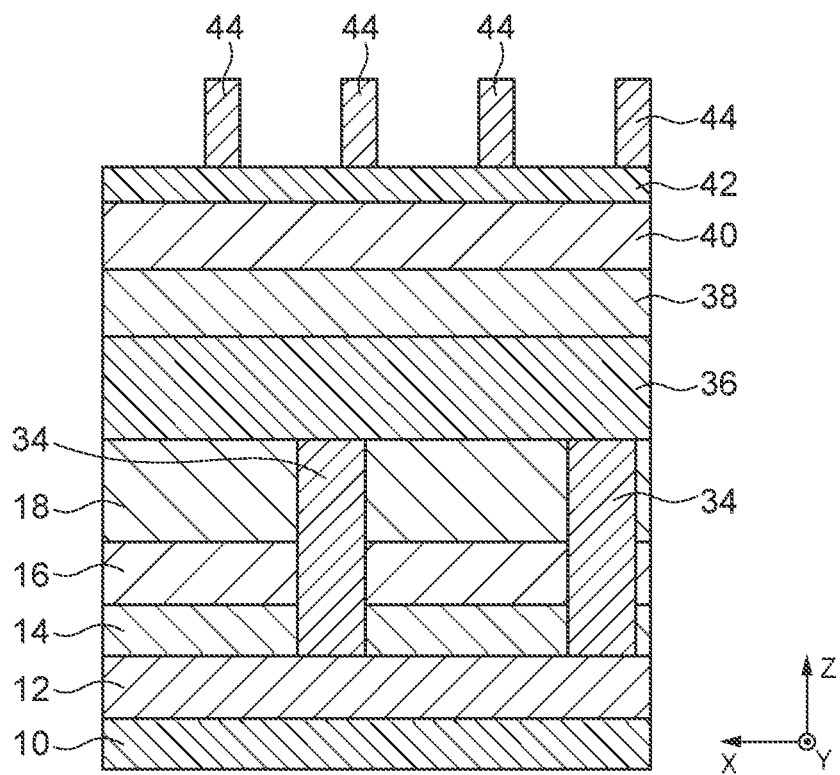

Next, the third sacrificial film 20 is removed as illustrated in FIGS. 12A and 12B. Next, as illustrated in FIGS. 13A and 13B, second insulating films 34 are embedded in the openings 32, and then a seventh sacrificial film 36, an eighth sacrificial film 38, a ninth sacrificial film 40, a tenth sacrificial film 42, and a patterned third resist 44 are formed on the second sacrificial film 18 and the second insulating films 34.

The second insulating films 34 are embedded in the openings 32 as follows. First, an insulating film is formed in the openings 32 and on the top face of the second sacrificial film 18, for example, by CVD. For example, silicon dioxide is used as the insulating film. Thereafter, the insulating film is etched back by performing anisotropic dry etching, and the etching is stopped at the time when the top face of the second sacrificial film 18 is exposed, whereby the second insulating films 34 embedded in the openings 32 can be formed.

The seventh sacrificial film 36, the eighth sacrificial film 38, the ninth sacrificial film 40, and the tenth sacrificial film 42 contain insulating materials. The seventh sacrificial film 36 contains, for example, silicon nitride. The eighth sacrificial film 38 contains, for example, silicon-containing amorphous carbon. The ninth sacrificial film 40 contains, for example, amorphous carbon. Since the eighth sacrificial film 38 contains, for example, silicon-containing amorphous carbon, the etching rate thereof is different from that of the ninth sacrificial film 40. The tenth sacrificial film 42 contains, for example, silicon dioxide. The seventh sacrificial film 36, the ninth sacrificial film 40, and the tenth sacrificial film 42 are formed, for example, by CVD. The eighth sacrificial film 38 is formed, for example, by CVD or by applying a coating liquid containing silicon-containing amorphous carbon and curing the coating liquid with a baking process.

The third resist 44 is patterned by the known lithography technology. Each of the patterned third resists 44 has a line-shape pattern extending in the Y direction. The third resist 44 is patterned so that the patterned third resists 44 are arranged at equal intervals in a line-and-space layout. The patterned third resists 44 are arranged so that every other patterned third resist overlaps one edge of the second insulating film 34 in the X direction. The width of each patterned third resist 44 has the dimension of about P/2 which is half of the repeating pitch P of the bit-lines 5 described above. The repeating pitch of the patterned third resists 44 is equal to 2P which is twice the repeating pitch P of the bit-lines 5 described above.

Figure 14A:
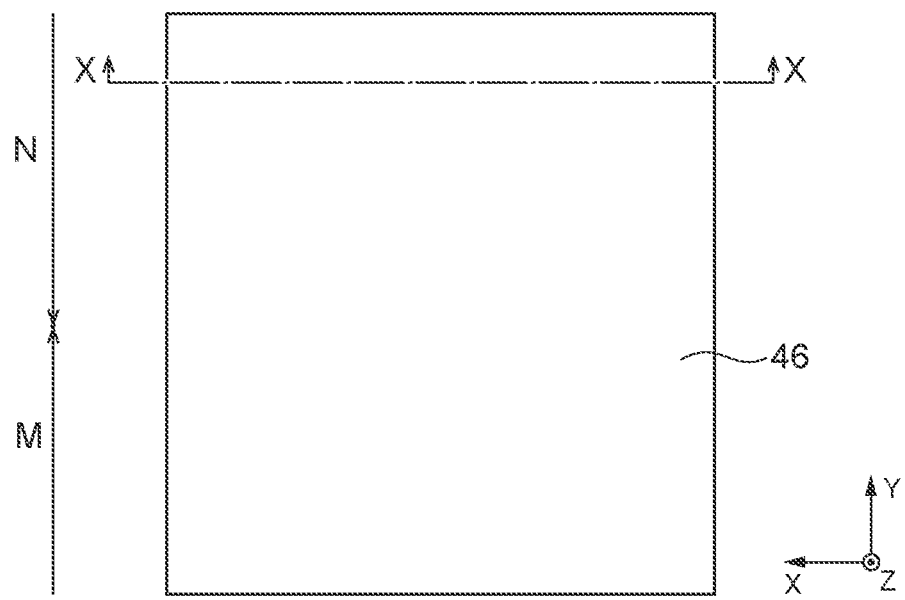
Figure 14B:
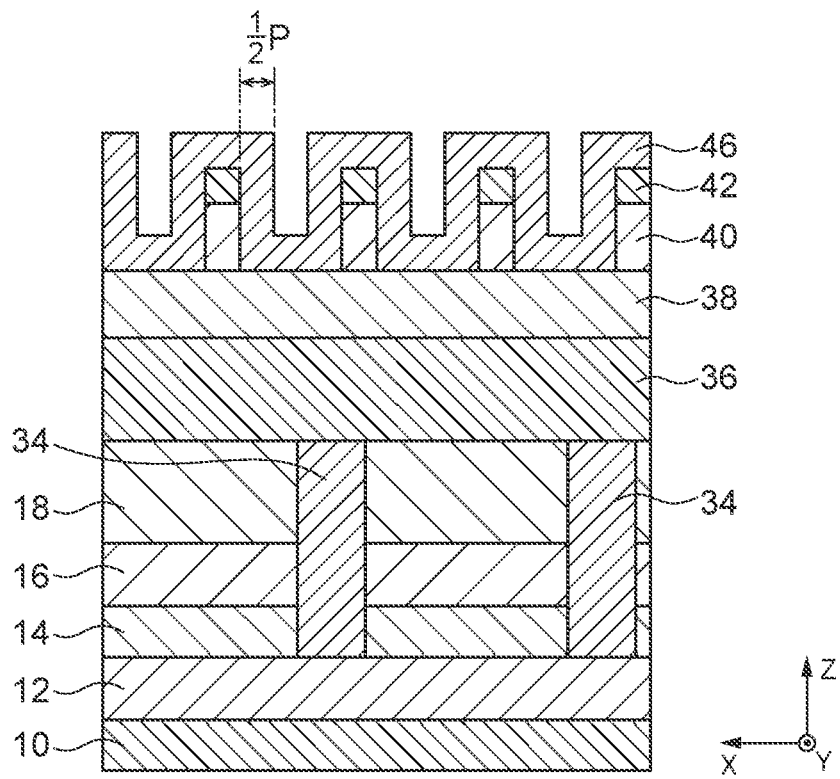

Next, as illustrated in FIGS. 14A and 14B, anisotropic dry etching is performed using the third resists 44 as an etching mask to etch the tenth sacrificial film 42 and the ninth sacrificial film 40. This anisotropic dry etching is stopped at the time when the top face of the eighth sacrificial film 38 is exposed. Subsequently, the third resists 44 are removed, and an eleventh sacrificial film 46 is formed so as to cover the top face of the eighth sacrificial film 38, the top and side faces of the tenth sacrificial film 42, and the side face of the ninth sacrificial film 40. The eleventh sacrificial film 46 contains an insulating material, for example contains silicon dioxide. The eleventh sacrificial film 46 is formed, for example, by CVD.

Figure 15A:
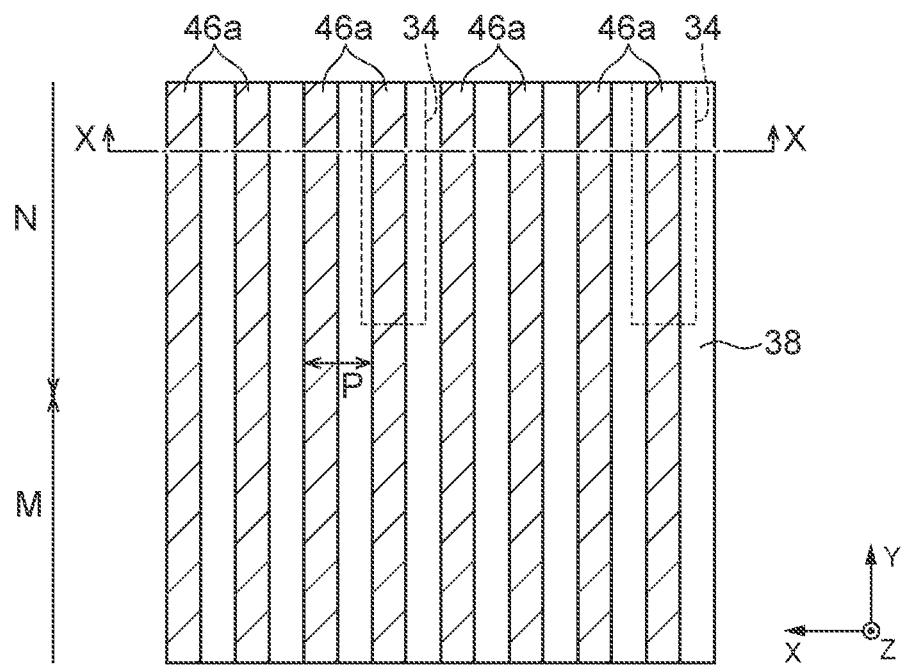
Figure 15B:
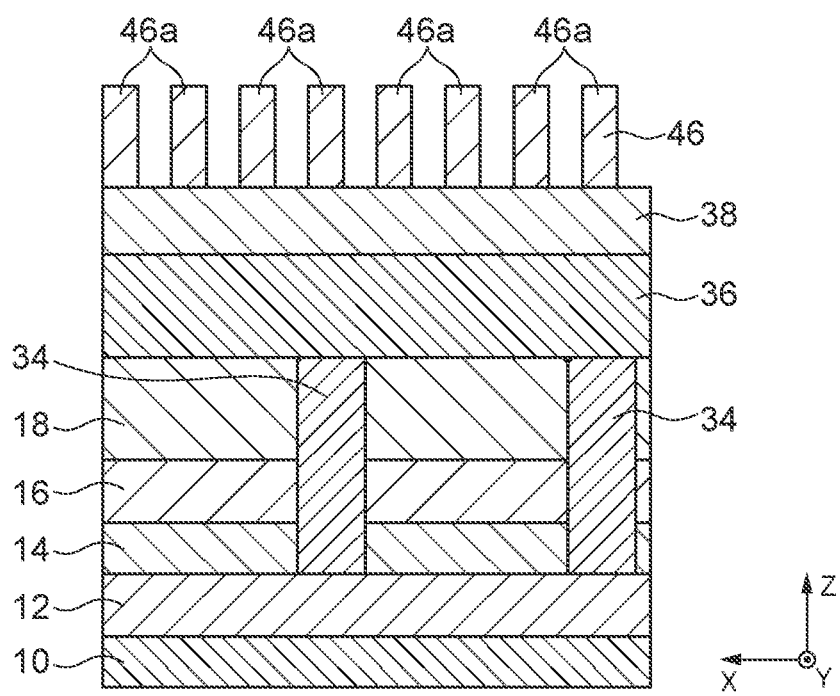

Next, as illustrated in FIGS. 15A and 15B, anisotropic dry etching is performed on the eleventh sacrificial film 46 to perform etch back by the amount corresponding to the thickness of the eleventh sacrificial film 46. As a result, the eleventh sacrificial film 46 remains on the side face parts of the tenth sacrificial film 42 and the ninth sacrificial film 40, and the remaining eleventh sacrificial film 46 becomes line-shaped masks 46a. The line-shaped masks 46a are formed to have line-shapes extending in the Y direction. The line-shaped masks 46a are formed in a line-and-space layout arranged at equal intervals. The repeating pitch in the X direction of the line-shaped masks 46a is the same P as the repeating pitch P of the bit-lines 5 described above. The line-shaped masks 46a are arranged so that the line-shaped masks 46a are located on the second insulating films 34 every four line-shaped masks 46a.

Figure 16A:
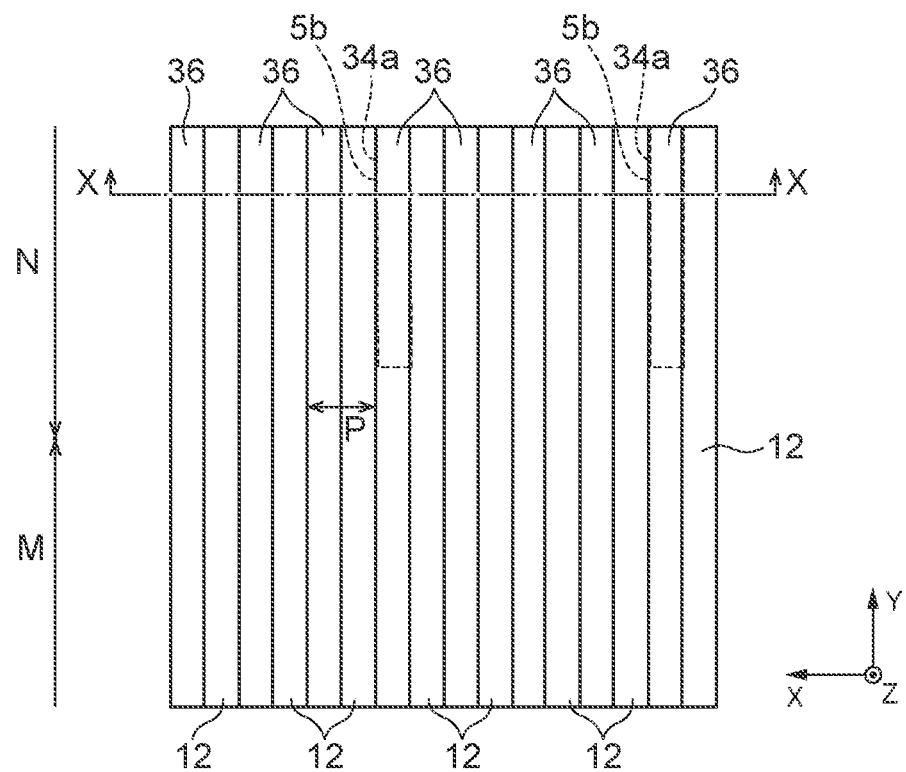
Figure 16B:
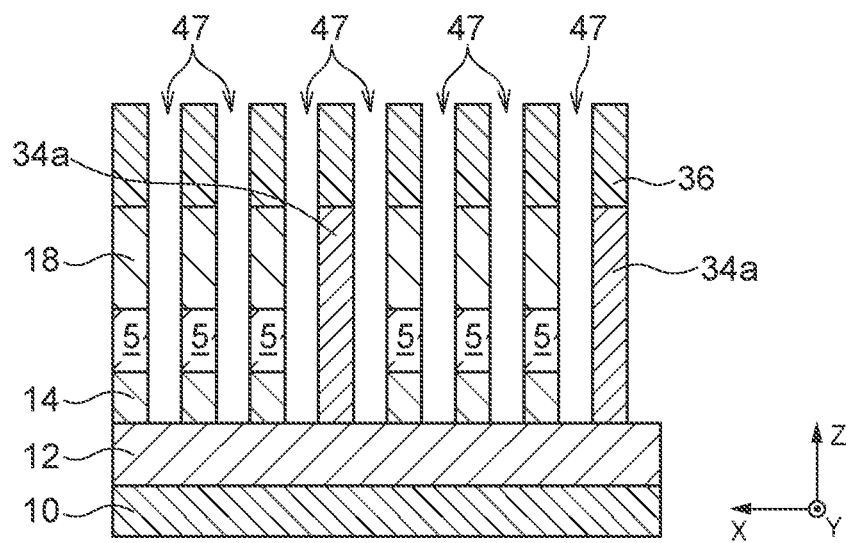

Next, as illustrated in FIGS. 16A and 16B, anisotropic dry etching is performed on the eighth sacrificial film 38, the seventh sacrificial film 36, the second insulating films 34, the second sacrificial film 18, the conductive film 16, and the first sacrificial film 14 using the line-shaped masks 46a as an etching mask. The top face of the first insulating film 12 is exposed by this anisotropic dry etching. Next, the line-shaped masks 46a and the eighth sacrificial film 38 are removed. By this anisotropic dry etching, the shapes of the line-shaped masks 46a are transferred to the seventh sacrificial film 36, the second insulating films 34, the second sacrificial film 18, the conductive film 16, and the first sacrificial film 14.

As illustrated in FIGS. 16A and 16B, the conductive film 16 is patterned to form the bit-lines 5. Further, in a portion along the X-X line, the second insulating films 34 are patterned to form a pillar-shaped insulating films 34a. Since three line-shaped masks 46a exist above a region where the conductive film 16 exists, the shapes of the line-shaped masks 46a are transferred to the conductive film 16 to form the bit-lines 5.

One line-shaped mask 46a exists above a region where the second insulating film 34 exists. As a result, the shape of the line-shaped mask 46a is transferred to form one pillar-shaped insulating film 34a. As described in the step illustrated in FIGS. 11A and 11B, when the openings 32 are formed, the conductive film 16 is removed at these portions, and the second insulating film 34 is obtained by embedding the opening 32 with an insulating material. Therefore, since the conductive film 16 does not exist in the second insulating films 34, the pillar-shaped insulating films 34a do not include the bit-lines 5. In other words, as illustrated in FIG. 16A and the like, the pillar-shaped insulating films 34a serve as the bit-line non-existing regions 5b in which no bit-line 5 exists.

Through the above steps, the bit-lines 5 and the pillar-shaped insulating film 34a are arranged such that the three bit-lines and one pillar-shaped insulating film 34a, that is, the bit-line non-existing region 5b are grouped as a group and this group is repeated. In this way, as illustrated in FIGS. 16A and 16B, in a portion along the X-X line, the three bit-lines 5 and the pillar-shaped insulating film 34a in which no bit-line 5 exists, that is, the bit-line non-existing region 5b are alternately arranged repeatedly.

Figure 17A:
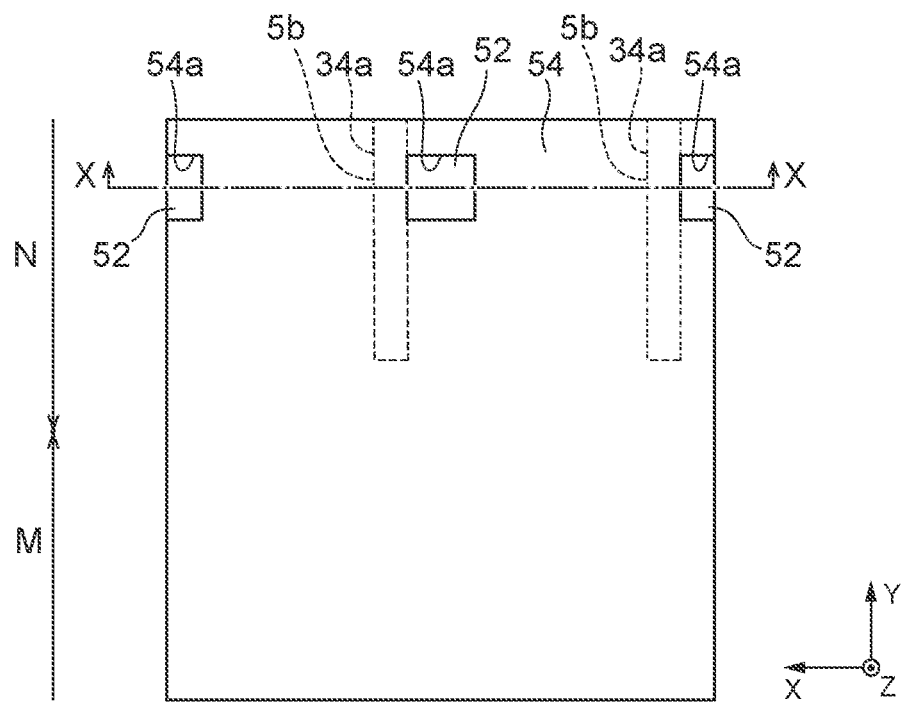
Figure 17B:
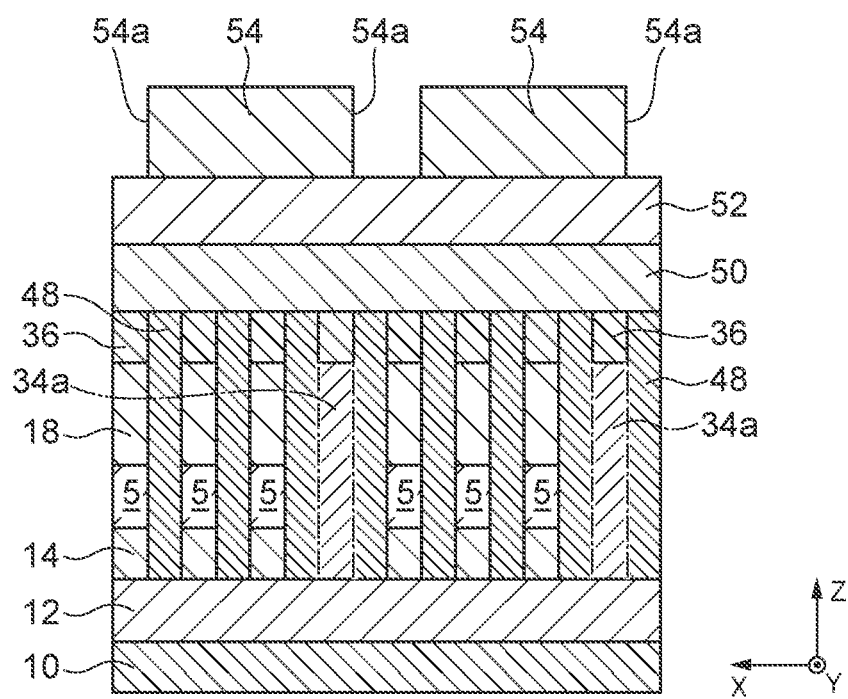

Next, as illustrated in FIGS. 17A and 17B, the patterned first sacrificial film 14, a third insulating film 48 is formed so as to fill gaps 47 among the first sacrificial film 14, the conductive film 16, that is, bit-lines 5, the second sacrificial film 18, the seventh sacrificial film 36, and the pillar-shaped insulating films 34a which have been patterned. The third insulating film 48 contains an insulating material. The third insulating film 48 contains, for example, silicon dioxide. The third insulating film 48 is formed, for example, by forming an insulating material so that the insulating material covers the inside of the gaps 47 and the top face of the seventh sacrificial film 36 by CVD and then etching back the insulating material until the top face of the seventh sacrificial film 36 is exposed.

Thereafter, a twelfth sacrificial film 50 and a thirteenth sacrificial film 52 are formed so as to cover the top face of the seventh sacrificial film 36 and the top face of the third insulating film 48, and further a patterned fourth resist 54 is formed on the thirteenth sacrificial film 52. The twelfth sacrificial film 50 and the thirteenth sacrificial film 52 contain insulating materials. The twelfth sacrificial film 50 contains, for example, silicon-containing amorphous carbon, and the thirteenth sacrificial film 52 contains, for example, amorphous carbon.

The twelfth sacrificial film 50 is formed, for example, by CVD or by applying a coating liquid containing silicon-containing amorphous carbon and curing the coating liquid with a baking process. The thirteenth sacrificial film 52 is formed, for example, by CVD. Since the twelfth sacrificial film 50 contains, for example, silicon-containing amorphous carbon, the etching rate thereof is different from that of the thirteenth sacrificial film 52. The fourth resist 54 is patterned by the known lithography technology. Openings 54a are formed in the fourth resist 54. The openings 54a are laid out so as to be close to one side of each bit-line non-existing region 5b in the peripheral region N.

Figure 18A:
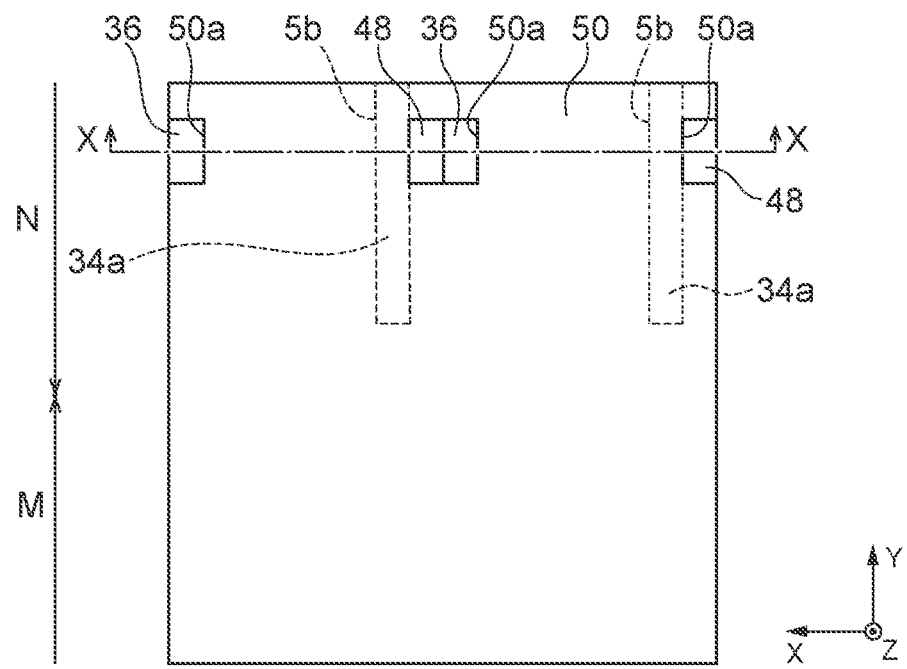
Figure 18B:
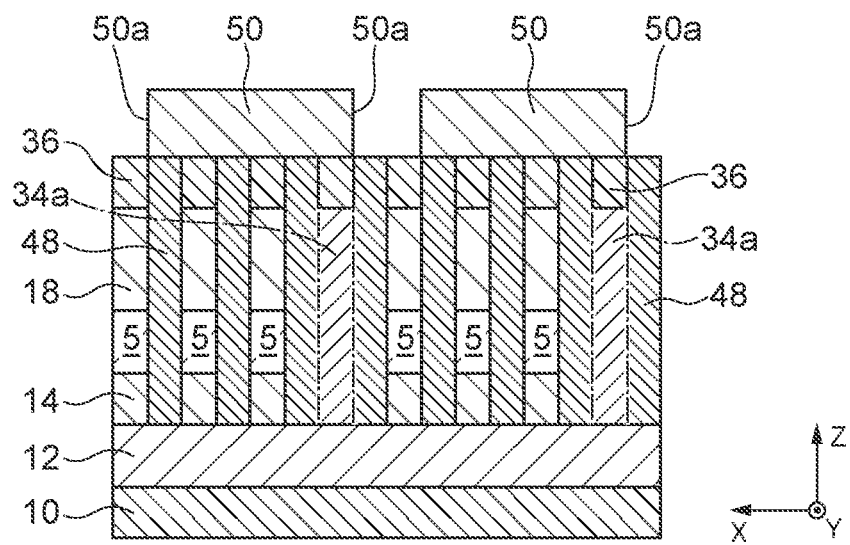

Next, as illustrated in FIGS. 18A and 18B, anisotropic dry etching is performed on the thirteenth sacrificial film 52 and the twelfth sacrificial film 50 using the fourth resist 54 as an etching mask. Anisotropic dry etching is performed until the top faces of the seventh sacrificial film 36 and the third insulating film 48 are exposed. As a result, the pattern of the fourth resist 54 including the openings 54a is transferred to the twelfth sacrificial film 50, and openings 50a are formed in the twelfth sacrificial film 50. Next, the fourth resist 54 and the thirteenth sacrificial film 52 are removed.

Figure 19A:
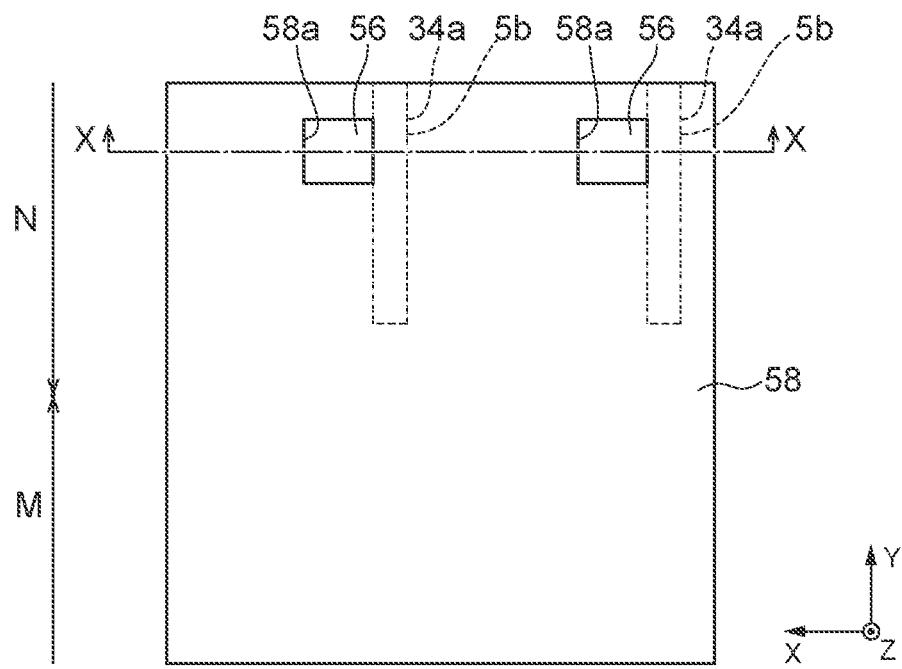
Figure 19B:
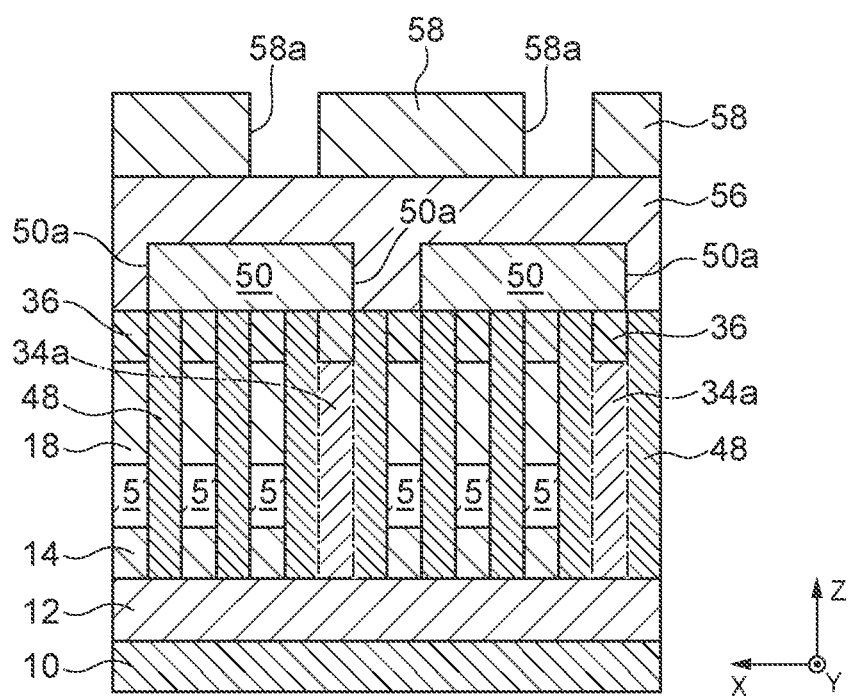

Next, as illustrated in FIGS. 19A and 19B, a fourteenth sacrificial film 56 is formed so as to cover the side and top faces of the twelfth sacrificial film 50. The Fourteenth sacrificial film 56 contains an insulating material, for example, amorphous carbon. The fourteenth sacrificial film 56 is formed, for example, by CVD. A patterned fifth resist 58 is formed on the fourteenth sacrificial film 56. The fifth resist 58 is patterned by using a known lithography technology. Openings 58a are formed in the fifth resist 58. The openings 58a are laid out in the peripheral region N such that each opening 58a is close to the other side of the bit-line non-existing region 5b, that is, the opposite side to the opening 50a with respect to the bit-line non-existing region 5b.

Figure 20A:
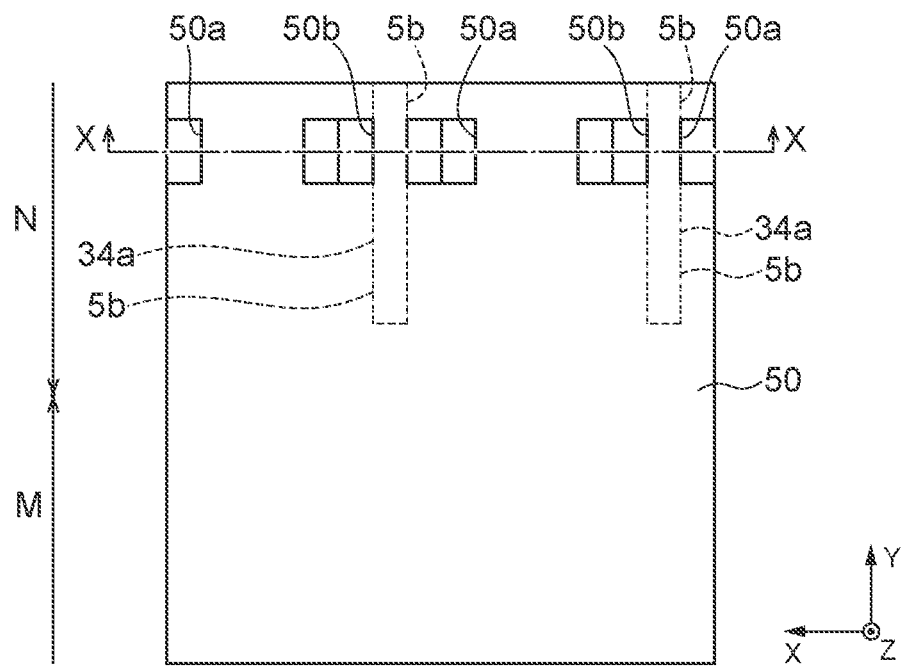
Figure 20B:
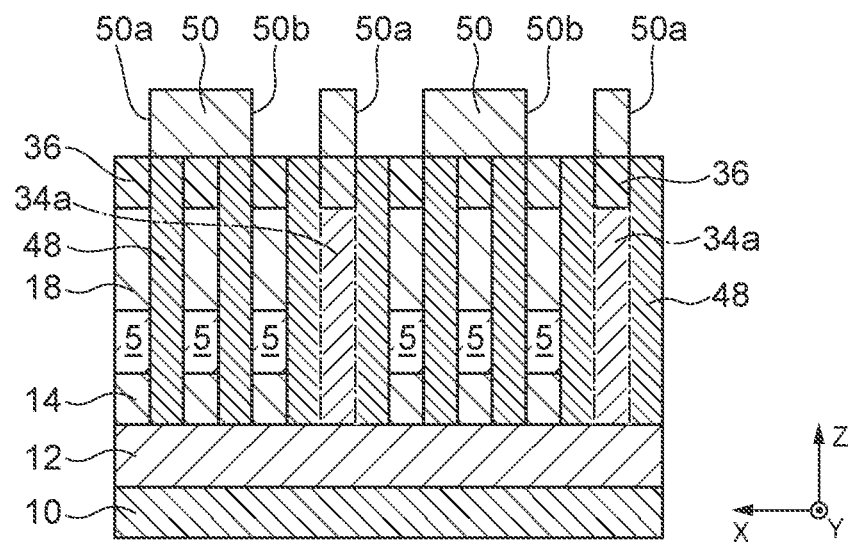

Next, as illustrated in FIGS. 20A and 20B, anisotropic dry etching is performed on the fourteenth sacrificial film 56 and the twelfth sacrificial film 50 using the fifth resist 58 as an etching mask to form openings 50b. Thereafter, the fifth resist 58 and the fourteenth sacrificial film 56 are removed. As a result, the openings 50a and the openings 50b are formed in the twelfth sacrificial film 50. In the peripheral region N, the openings 50a and 50b are laid out so as to interpose the bit-line non-existing regions 5b therebetween in the X direction. The distance between the openings 50a and 50b on the side where they interpose the bit-line non-existing region 5b therebetween is shorter than the distance between the openings 50a and 50b on the side where they do not interpose the bit-line non-existing region 5b therebetween.

The openings 50a are patterned based on the openings 54a of the fourth resist 54. The openings 50b are patterned based on the opening 58a of the fifth resist 58. The openings 50a and 50b are formed based on different lithography steps. Therefore, the openings 50a and 50b can be laid out with the distance therebetween being shortened to the extent that it cannot be achieved by the same lithography step. As a result, since the openings 50a and 50b can be laid out to be close to the bit-line non-existing region 5b, the distance between the openings 50a and 50b on the side where the openings 50a and 50b do not interpose the bit-line non-existing region 5b therebetween can be set to be large. Therefore, it is possible to prevent the openings 50a and 50b from opening above the bit-lines 5 adjacent thereto.

Figure 21A:
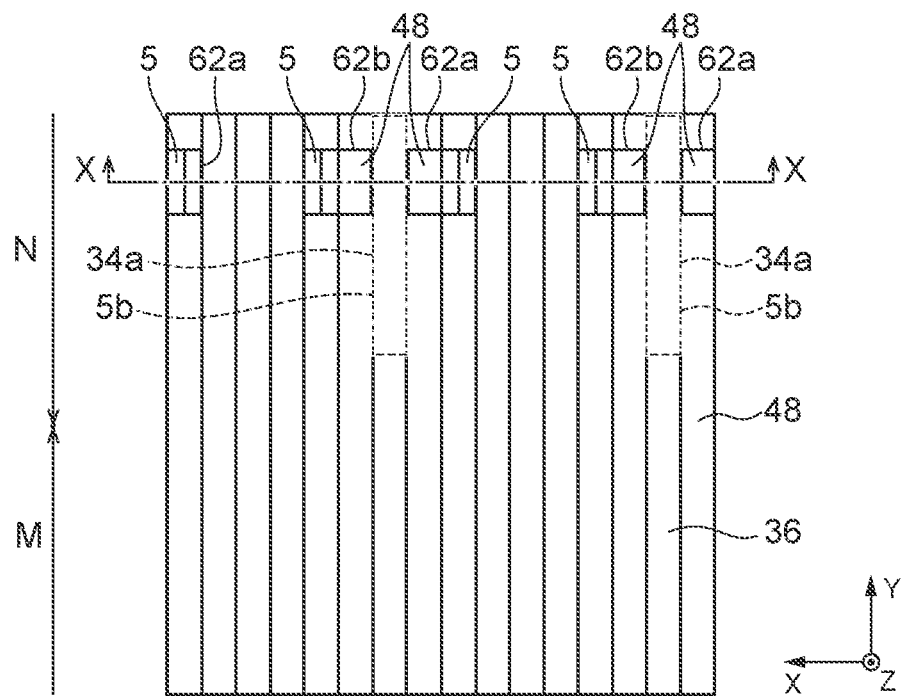
Figure 21B:
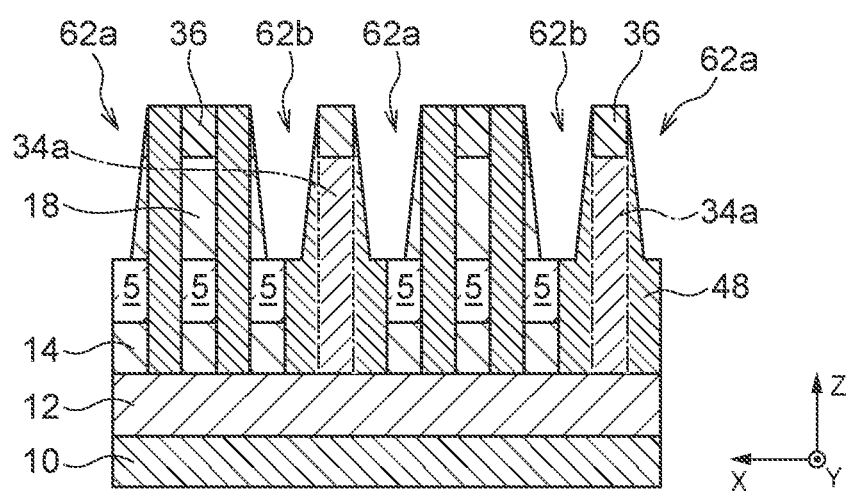

Next, as illustrated in FIGS. 21A and 21B, anisotropic dry etching is performed on the third insulating film 48, the seventh sacrificial film 36, and the second sacrificial film 18 using the twelfth sacrificial film 50 having the openings 50a and 50b formed therein as an etching mask to form bit-line contact holes 62a and 62b reaching the top faces of the bit-lines 5. This anisotropic dry etching is controlled so that the etching rates of the third insulating film 48, the seventh sacrificial film 36, and the second sacrificial film 18 are substantially the same. Thereafter, the twelfth sacrificial film 50 is removed.

The bit-line contact holes 62a are patterned based on the openings 54a of the fourth resist 54. The bit-line contact holes 62b are patterned based on the openings 58a of the fifth resist 58. The bit-line contact holes 62a and the bit-line contact holes 62b are formed based on different lithography steps.

Figure 22A:
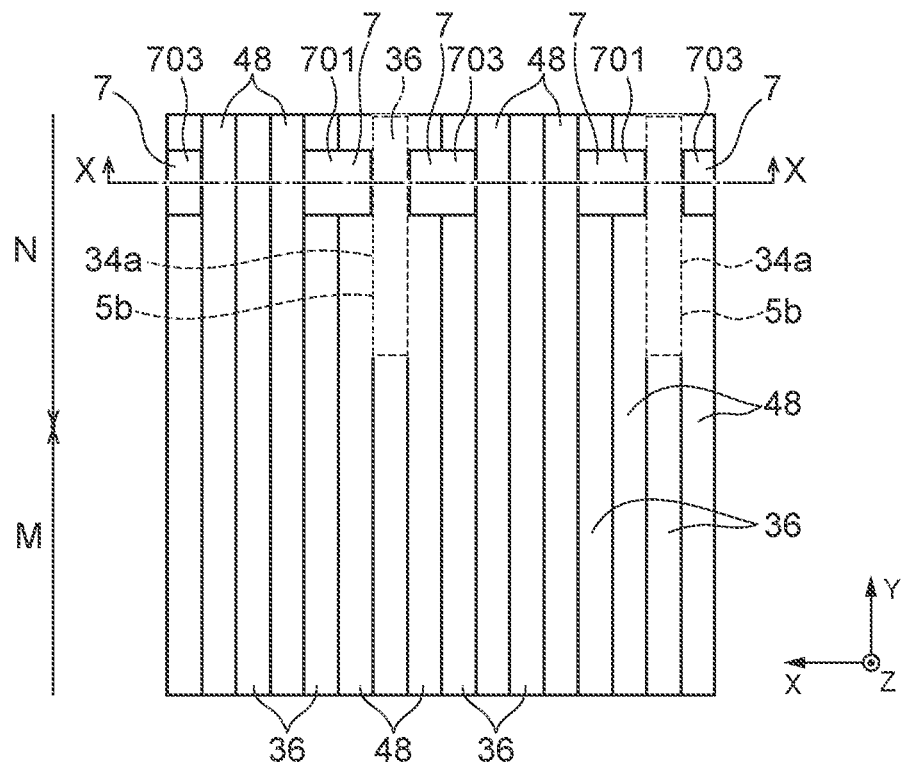
Figure 22B:
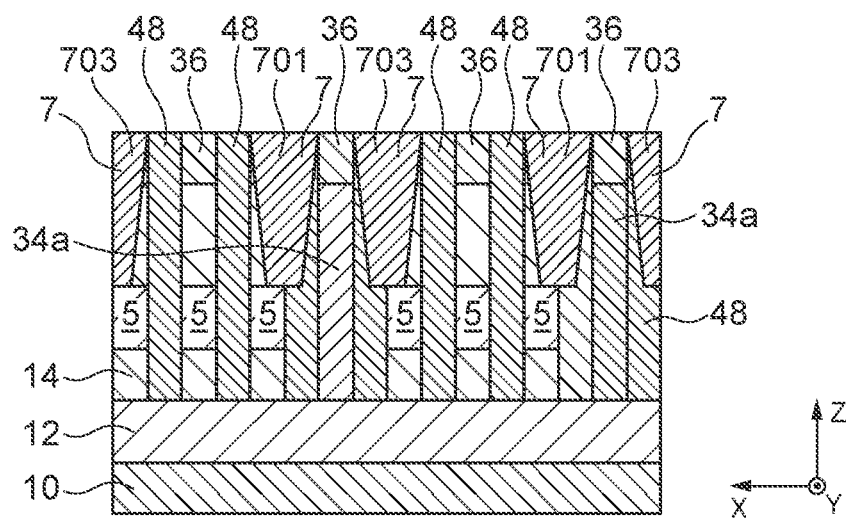

Next, as illustrated in FIGS. 22A and 22B, a conductive material is embedded in the bit-line contact holes 62a and 62b to form the bit-line contacts 701 and 703. The bit-line contacts 703 are formed in the bit-line contact holes 62a, and the bit-line contacts 701 are formed in the bit-line contact holes 62b. The conductive material includes, for example, tungsten (W).

A tungsten film is formed so as to cover the insides of the bit-line contact holes 62a and 62b, the top face of the seventh sacrificial film 36 and the top face of the third insulating film 48, for example, by using CVD, and then the thus-formed tungsten film is etched back until the top face of the seventh sacrificial film 36 and the top face of the third insulating film 48 are exposed, thereby forming the bit-line contacts 701 and 703. The bit-line contacts 702 and 704 are likewise formed in the memory mat end region B. Through the above steps, the semiconductor device according to the embodiment is formed.

In the semiconductor device according to the embodiment, the bit-line contact holes 62a and 62b are laid out in the peripheral region N so as to interpose the bit-line non-existing region 5b therebetween in the X direction. The distance between the bit-line contact hole 62a and the bit-line contact hole 62b on the side where they interpose the bit-line non-existing region 5b therebetween is shorter than the distance between the bit-line contact hole 62a and the bit-line contact hole 62b on the side where they do not interpose the bit-line non-existing region 5b therebetween.

The bit-line contact holes 62b are patterned based on the openings 54a of the fourth resist 54. The bit-line contact holes 62a are patterned based on the openings 58a of the fifth resist 58. The bit-line contact holes 62a and the bit-line contact holes 62b are formed based on different lithography steps. Therefore, the distance between the bit-line contact hole 62a and the bit-line contact hole 62b can be shortened to the extent that it cannot be achieved by forming these bit-line contact holes based on the same lithography step.

As a result, the distance between the bit-line contact hole 62a and the bit-line contact hole 62b on the side where they interpose the bit-line non-existing region 5b therebetween enables the bit-line contact holes 62a and 62b to be laid out so as to be close to the bit-line non-existing region 5b. Therefore, the distance between the bit-line contact hole 62a and the bit-line contact hole 62b on the side where they do not interpose the bit-line non-existing region 5b therebetween can be set to be large. As above, it is possible to avoid or suppress the bit-line contact hole 62a and the bit-line contact hole 62b from being short-circuited with the bit-line 5 adjacent thereto. Therefore, the manufacturing yield of the semiconductor device according to the embodiment can be improved.

As above, the distance between the bit-line contact hole 62a and the adjacent bit-line 5 and the distance between the bit-line contact hole 62b and the adjacent bit-line 5 on the side where they do not interpose the bit-line non-existing region 5b therebetween can be set to be large. As a result, it is possible to avoid or suppress the bit-line contact hole 62a and the bit-line contact hole 62b from being short-circuited with the adjacent bit-lines 5. Therefore, the manufacturing yield of the semiconductor device according to the embodiment can be improved.

As above, the semiconductor device according to the embodiment has been described by exemplifying the bit-lines and the bit-line contacts of the DRAM. However, the above description is merely one example and not intended to be limited to the bit-lines and the bit-line contacts. The embodiment is applied not only to bit-lines, but also to word-lines and word-line contacts and other wirings and contacts.

As above, DRAM is described as an example of the semiconductor device according to the embodiment, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a memory cell region;
a peripheral region adjacent to the memory cell region;
first, second, third, fourth and fifth bit-lines arranged in numerical order and extending across the memory cell region and the peripheral region; and
first, second and third bit-line contacts connecting with the first, third and fifth bit-lines in the peripheral region, respectively;
wherein the first and second bit-line contacts are arranged adjacently without interposing the second bit-line therebetween; and
wherein the second and third bit-line contacts are arranged adjacently with interposing the fourth bit-line therebetween.

2. The apparatus of claim 1, wherein first distance between the first bit-line contact and the second bit-line contact is shorter than second distance between the second bit-line contact and the third bit-line contact.

3. The apparatus of claim 1, wherein the first, second, third, fourth and fifth bit-lines are arranged with a predetermined repeating pitch.

4. The apparatus of claim 1, wherein a center of width of the first bit-line contact is shifted from a center of width of the first bit-line and a center of width of the second bit-line contact is shifted from a center of width of the third bit-line.

5. The apparatus of claim 1, wherein the center of width of the first bit-line contact is shifted from the center of width of the first bit-line in a first direction and the center of width of the second bit-line contact is shifted from the center of width of the third bit-line in a second direction opposite to the first direction.

6. The apparatus of claim 5, wherein the center of width of the third bit-line contact is shifted from the center of width of the fifth bit-line in the first direction.

7. The apparatus of claim 1, wherein the first, second, third, fourth and fifth bit-lines include at least either tungsten or titanium nitride.

8. The apparatus of claim 1, wherein the first, second and third bit-line contacts include tungsten.

9. An apparatus comprising:
a memory cell region;
a peripheral region adjacent to the memory cell region;
first, second and third bit-lines arranged in numerical order and extending across the memory cell region and the peripheral region; and
first and second bit-line contacts connecting with the first and third bit-lines in the peripheral region, respectively;
wherein a center of width of the first bit-line contact is shifted from a center of width of the first bit-line and a center of width of the second bit-line contact is shifted from a center of width of the third bit-line.

10. The apparatus of claim 9, wherein the center of width of the first bit-line contact is shifted from the center of width of the first bit-line in a first direction and the center of width of the second bit-line contact is shifted from the center of width of the third bit-line in a second direction opposite to the first direction.

11. The apparatus of claim 9, wherein the centers of widths of the first and second bit-line contacts are shifted such that the first and second bit-line contacts get close to each other.

12. The apparatus of claim 9, wherein the first, second and third bit-lines are arranged with a predetermined repeating pitch.

13. The apparatus of claim 9, wherein the first and second bit-line contacts are arranged adjacently without interposing the second bit-line therebetween.

14. The apparatus of claim 9, wherein a length of each of the first and third bit-lines is longer than a length of the second bit-line in the peripheral region.

15. The apparatus of claim 9, wherein the first, second and third bit-lines include at least either tungsten or titanium nitride.

16. The apparatus of claim 9, wherein the first and second bit-line contacts include tungsten.

\* \* \* \* \*